(12) United States Patent
Lee et al.

(10) Patent No.: US 11,507,148 B2
(45) Date of Patent: Nov. 22, 2022

(54) PORTABLE SOLID-STATE DRIVE MODULE

(71) Applicant: SAMSUNG ELECTRONICS CO., LTD., Suwon-si (KR)

(72) Inventors: Hanhong Lee, Suwon-si (KR); Jaehong Park, Suwon-si (KR); Yusuf Cinar, Yongin-si (KR); Seongyun Baek, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 193 days.

(21) Appl. No.: 16/909,337

(22) Filed: Jun. 23, 2020

(65) Prior Publication Data
US 2021/0157372 A1 May 27, 2021

(30) Foreign Application Priority Data
Nov. 25, 2019 (KR) .................. 10-2019-0152241

(51) Int. Cl.
*G06F 1/18* (2006.01)
*F21V 33/00* (2006.01)
*F21V 17/10* (2006.01)
*F21Y 115/10* (2016.01)

(52) U.S. Cl.
CPC ............ *G06F 1/182* (2013.01); *F21V 17/104* (2013.01); *F21V 33/0052* (2013.01); *F21Y 2115/10* (2016.08)

(58) Field of Classification Search
CPC ..... G06F 1/182; F21V 17/104; F21V 33/0052
USPC .................................... 361/679.32
See application file for complete search history.

(56) References Cited

U.S. PATENT DOCUMENTS

| | | | |
|---|---|---|---|
| 5,612,927 A * | 3/1997 | Morrison ............. | G11B 33/124 360/99.07 |
| 5,886,869 A * | 3/1999 | Fussell .................. | G06F 1/184 |
| 8,797,297 B2 | 8/2014 | Yabuta et al. | |
| 9,543,638 B2 | 1/2017 | Kim | |
| 9,875,773 B1 * | 1/2018 | Waters ................. | G11B 33/142 |
| 10,068,619 B1 * | 9/2018 | Chew .................. | H04M 1/0256 |
| 10,104,796 B1 | 10/2018 | Lin | |
| 10,237,383 B2 | 3/2019 | Park | |

(Continued)

FOREIGN PATENT DOCUMENTS

| KR | 10-2002-0075087 | 10/2002 |
|---|---|---|
| KR | 10-1147400 | 5/2012 |

(Continued)

OTHER PUBLICATIONS

Notice of Allowance dated May 6, 2021 in related U.S. Appl. No. 16/878,925 (12 pages).

(Continued)

*Primary Examiner* — Bryon T Gyllstrom
(74) *Attorney, Agent, or Firm* — F. Chau & Associates, LLC

(57) ABSTRACT

The present disclosure relates to a portable solid-state drive (SSD) module. The portable SSD module includes a case, an SSD, a light-emitting device (LED) module and a main bracket. The case may have a window. The SSD may be arranged in the case. The LED module may be arranged in the case to indicate an operation of the SSD through the window. The main bracket may be arranged in the case to support the LED module. Therefore, the LED module may be readily and firmly combined with the case.

17 Claims, 20 Drawing Sheets

(56) References Cited

U.S. PATENT DOCUMENTS

| | | | |
|---|---|---|---|
| 2002/0175632 A1 | 11/2002 | Takeguchi | |
| 2004/0190192 A1* | 9/2004 | Huang | G11B 33/122 |
| 2005/0013127 A1 | 1/2005 | Tsai | |
| 2009/0316351 A1* | 12/2009 | Zadesky | G06F 1/1626 |
| | | | 361/679.02 |
| 2011/0194305 A1 | 8/2011 | Chen et al. | |
| 2014/0269240 A1* | 9/2014 | Phelan | G11B 33/122 |
| | | | 362/418 |
| 2014/0362576 A1* | 12/2014 | Degner | H05K 7/2039 |
| | | | 362/253 |
| 2016/0327724 A1 | 11/2016 | Wu et al. | |
| 2018/0034948 A1 | 2/2018 | Yu et al. | |
| 2019/0377126 A1 | 12/2019 | Itabashi et al. | |

FOREIGN PATENT DOCUMENTS

| | | |
|---|---|---|
| KR | 10-1248092 | 3/2013 |
| KR | 10-2013-0077709 | 7/2013 |
| KR | 10-1327931 | 11/2013 |
| KR | 10-1411460 | 6/2014 |
| KR | 10-2014-0131152 | 11/2014 |
| KR | 10-2014-0135478 | 11/2014 |
| KR | 10-2014-0144667 | 12/2014 |
| KR | 10-2017-0021147 | 2/2017 |
| KR | 10-1726993 | 4/2017 |
| KR | 10-1738394 | 5/2017 |
| KR | 10-2018-0014914 | 2/2018 |

OTHER PUBLICATIONS

Office Action dated Dec. 10, 2020 in co-pending U.S. Appl. No. 16/878,925.

* cited by examiner

PORTABLE SOLID-STATE DRIVE MODULE

CROSS-RELATED APPLICATION

This application claims priority under 35 USC § 119 to Korean Patent Application No. 10-2019-0152241, filed on Nov. 25, 2019 in the Korean Intellectual Property Office (KIPO), the contents of which are incorporated by reference herein in its entirety.

BACKGROUND

1. Field

Example embodiments relate to a portable solid-state drive (SSD) module.

2. Description of the Related Art

Electronic devices that are tasked with retaining information may contain a storage device. Storage devices include hard disk drives (HDD) and solid-state drives (SSD). Speed and reliability have created a high demand for SSDs.

An SSD may also be usable outside of an electronic device. This configuration may be referred to as an external SSD. For example, an external SSD may be placed on a desk to supplement storage usage for a computer. A case may surround the SSD device to protect sensitive components from shock or external elements.

An SSD case design may include a light-emitting diode (LED) used to indicate operation of the SSD. However, in certain situations, the LED may not be robustly fastened to the case. Additionally, the LED may not provide uniform brightness (e.g., based on the shape of the LED). Therefore, there is a need in the art for an SSD with a case arranged in such a way to firmly mount the LED module to the case and uniformly diffuse light from the LED module.

SUMMARY

Embodiments of the present disclosure relate to an external solid-state drive (SSD). Example embodiments provide a portable solid-state drive (SSD) module that may be capable of readily and firmly combining an LED module with a case and uniformly diffusing a light from the LED module.

According to example embodiments, a portable SSD module is provided that may include a case, an SSD, a light-emitting device (LED) module and a main bracket. The SSD may be arranged in the case. In some cases, the case may have a window, and the LED module may be arranged in the case to indicate an operation of the SSD through the window. The main bracket may be arranged in the case to support the LED module.

In some cases, the portable SSD module may include a case, an SSD, a fingerprint sensor, a main bracket and a front bracket. The case may have an open front surface, an open rear surface and a window. The SSD may be arranged in the case. The fingerprint sensor may be exposed through the window to recognize a fingerprint a user for securing the SSD. The main bracket may be inserted into the case through the open rear surface of the case to support the fingerprint sensor. The front bracket may be inserted into the case through the open front surface of the case to support connectors for electrically connecting the SSD with the fingerprint sensor.

According to example embodiments, a portable SSD module may include a case, an SSD, an LED module, a fingerprint sensor, a main bracket and a front bracket. The case may have an open front surface, an open rear surface and a window. The SSD may be arranged in the case. The LED module may be arranged in the case to indicate an operation of the SSD through the window. The fingerprint sensor may be installed at the LED module. The fingerprint sensor may be exposed through the window to recognize a fingerprint a user for securing the SSD. The main bracket may be inserted into the case through the open rear surface of the case to support the LED module and the fingerprint sensor. The front bracket may be inserted into the case through the open front surface of the case to support connectors for electrically connecting the SSD with the LED module and the fingerprint sensor.

According to example embodiments, a portable SSD module may include a case, an SSD, an LED module, a fingerprint sensor, a main bracket, a front bracket and a thermal pad. The case may have an open front surface, an open rear surface, an upper surface having a window and a lower surface. The SSD may be arranged on the lower surface of the case. The LED module may include at least one LED arranged in the case and an indicator configured to indicate a light emitted from the LED through the window. The indicator may include a diffusing groove configured to diffuse the light emitted from the LED into the indicator. The diffusing groove may include a triangular shape having at least two diffusing surfaces. The fingerprint sensor may be installed at the LED module. The fingerprint sensor may be exposed through the window to recognize a fingerprint a user for securing the SSD.

The main bracket may include a body portion, a pair of horizontal supporting portions and a vertical supporting portion. The body portion may be inserted into the case through the open rear surface of the case. The body portion may be positioned between the case and the SSD. The horizontal supporting portions may be horizontally extended from both portions of a front surface of the body portion to support both side surfaces of the LED module. The vertical supporting portion may be arranged between the horizontal supporting portions to support a lower surface of the LED module. The vertical supporting portion may include at least one rib formed on an upper surface of the vertical supporting portion. The rib may be downwardly inclined from the rear surface to the front surface of the case. The rib may slidably make contact with the lower surface of the LED module. The front bracket may be inserted into the case through the open front surface of the case to support connectors for electrically connecting the SSD with the LED module and the fingerprint sensor. The thermal pad may be interposed between the main bracket and the SSD to dissipate a heat from the SSD.

According to example embodiments, there may be provided a portable SSD module. The portable SSD module may include a case, an SSD, a main bracket and a front bracket. The case may have a window. The SSD may be arranged in the case. The main bracket may be arranged in the case to support the SSD. The front bracket may be arranged in the case to support at least one connector extended from the SSD.

According to example embodiments, the main bracket may support the LED module. Particularly, the slant rib of the main bracket inserted into the rear surface of the case may slidably make contact with the lower surface of the LED module. Therefore, the LED module may be readily and firmly combined with the case.

Further, the indicator of the LED module may have the triangular diffusing groove so that the light from the LED may uniformly diffuse toward the whole indicator through the diffusing groove. Particularly, the light may diffuse toward a corner of the indicator. As a result, the indicator may have uniform brightness.

According to example embodiments, an apparatus may include a case comprising a top surface, a bottom surface, two side surfaces, an open front surface and an open rear surface, wherein the top surface comprises a window; a memory device arranged in the case; a lighting element arranged in the case, wherein the lighting element is configured to indicate an operation of the memory device through the window; a main bracket arranged in the case to support the lighting element, wherein the main bracket extends in a first direction from the open rear surface to the window.

In some examples, the apparatus further comprises a PCB arranged in the case and connected to the memory device; a connector connecting the lighting element to the PCB; and a front bracket arranged in the case and configured to support the connecter, wherein the front bracket extends in the first direction from the connector to the open front surface. In some examples, the apparatus further comprises a fingerprint sensor disposed adjacent to the lighting element, wherein the fingerprint sensor is configured to receive fingerprint information through the window.

BRIEF DESCRIPTION OF THE DRAWINGS

Example embodiments will be more clearly understood from the following detailed description taken in conjunction with the accompanying drawings.

FIG. 1 is an exploded perspective view illustrating a portable SSD module in accordance with example embodiments;

FIG. 2 is a cross-sectional view illustrating an internal structure of the portable SSD module in FIG. 1;

FIG. 3 is an enlarged perspective view illustrating a main bracket of the portable SSD module in FIG. 1;

FIG. 4 is a perspective view illustrating an LED module supported by the main bracket in FIG. 3;

FIG. 5 is an enlarged perspective view illustrating a rib of the main bracket in FIG. 3;

FIG. 6 is a perspective view illustrating a main bracket of a portable SSD module in accordance with example embodiments;

FIGS. 7 and 8 are perspective views illustrating main brackets of a portable SSD module in accordance with example embodiments;

FIG. 9 is a cross-sectional view illustrating a front internal structure of the SSD module in FIG. 1;

FIG. 10 is an enlarged perspective view illustrating an LED module of the portable SSD module in FIG. 1;

FIG. 11 is a plan view illustrating the LED module in FIG. 10;

FIGS. 12 and 13 are plan views illustrating an angle range of a diffusing groove of the LED module in FIG. 11;

FIG. 14 is a plan view illustrating an LED module in accordance with example embodiments;

FIG. 15 is a plan view illustrating an LED module in accordance with example embodiments;

FIGS. 16 to 20 are perspective views illustrating processes for combining the portable SSD module in FIG. 1;

FIG. 21 is an exploded perspective view illustrating a portable SSD module in accordance with example embodiments;

FIG. 22 is a cross-sectional view illustrating an internal structure of the portable SSD module in FIG. 21;

FIGS. 23 to 28 are perspective views illustrating processes for combining the portable SSD module in FIG. 21;

FIG. 29 is an exploded perspective view illustrating a portable SSD module in accordance with example embodiments;

FIG. 30 is a cross-sectional view illustrating a portable SSD module in accordance with example embodiments; and FIG. 31 is an enlarged cross-sectional view illustrating a portion "A" in FIG. 30.

DETAILED DESCRIPTION OF THE EMBODIMENTS

The present disclosure relates generally to a storage device and a light source connected to the storage device. The storage device may be a portable solid-state drive (SSD) module. The portable SSD module may include a case, a storage drive, a light-emitting device (LED) module and a main bracket. The case may have a window for use of a fingerprint sensor or the like. The SSD may be arranged inside the case. The LED module may be arranged inside the case to indicate an active operation of the SSD through the window. The main bracket may be arranged in the case to support the LED module. Therefore, the LED module may be readily and firmly combined with the case.

A main bracket may support the LED module. A slanted piece, of the main bracket, inserted into the rear surface of the case may contact the lower surface of the LED module. As a result, the LED module may be readily and firmly combined with the case.

The LED module may contain grooves to uniformly distribute light. A number of diffusing grooves may be formed at a number of outer surfaces of an indicating area. The LEDs may be arranged in the diffusing grooves.

Hereinafter, example embodiments will be explained in detail with reference to the accompanying drawings.

Hereinafter, some example embodiments will be explained in detail with reference to the accompanying drawings.

Figure 1:
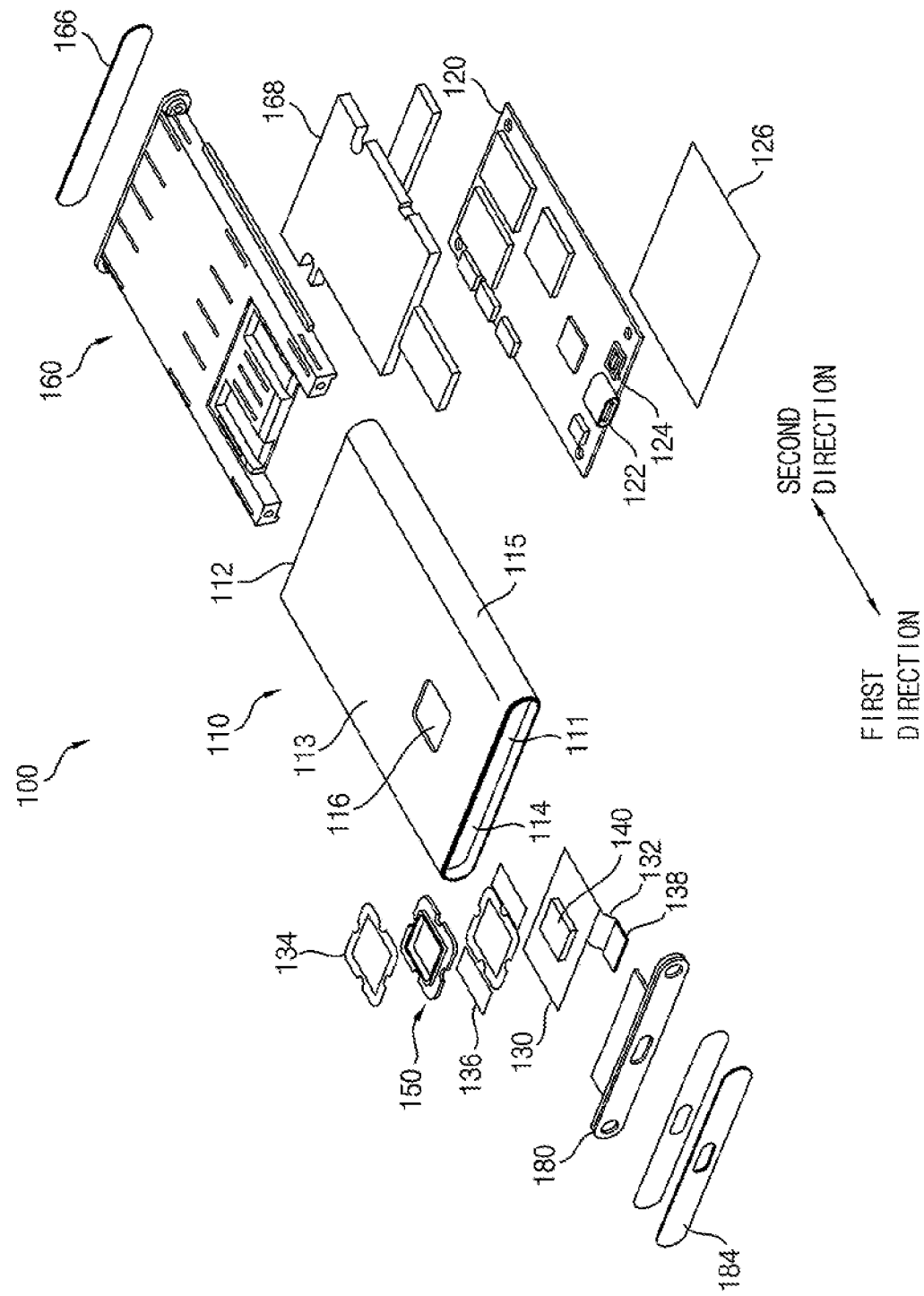
FIGS. 1 to 31 represent non-limiting, example embodiments as described herein.
Figure 2:
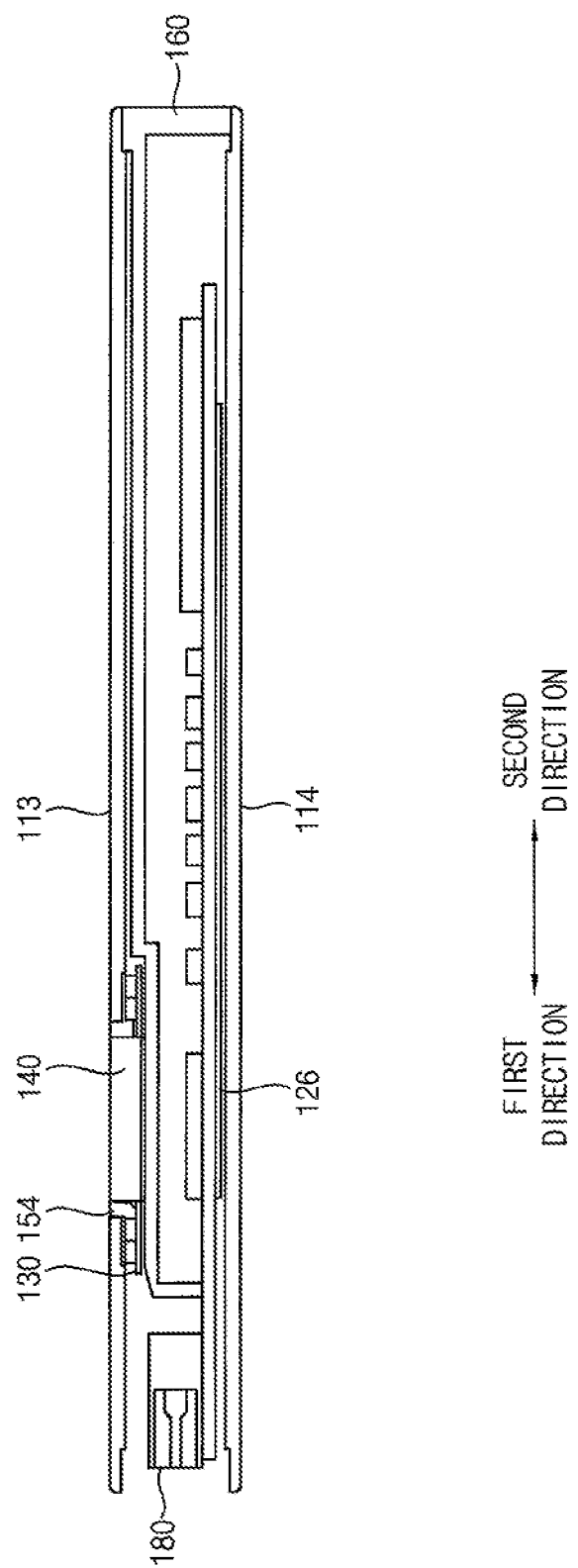
Figure 9:
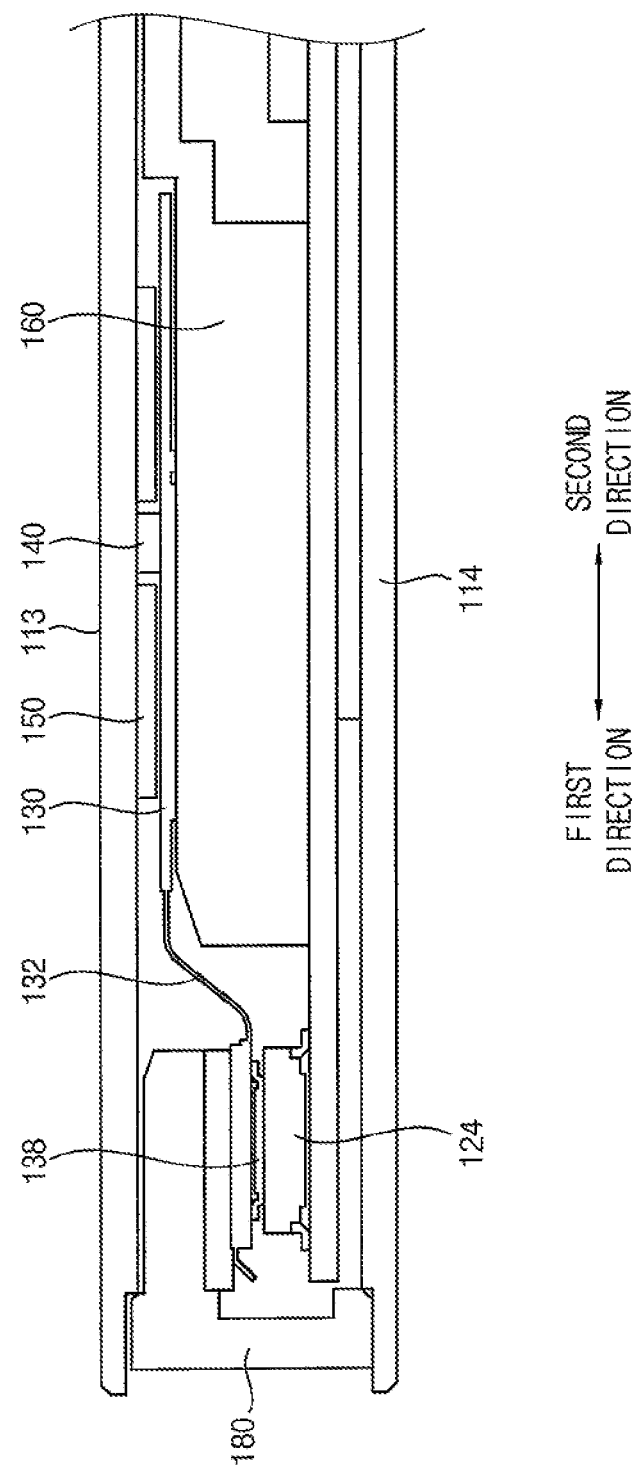

FIG. 1 is an exploded perspective view illustrating a portable SSD module in accordance with some example embodiments, and FIG. 2 is a cross-sectional view illustrating an internal structure of the portable SSD module in FIG. 1. FIG. 9 is a cross-sectional view illustrating a front internal structure of the SSD module in FIG. 1.

Referring to FIGS. 1 and 2, a portable SSD module 100 of some example embodiments may include a case 110, an SSD 120, a fingerprint sensor 140, an LED module 150, a main bracket 160 and a front bracket 180.

The case 110 may have a rectangular parallelepiped shape having an empty internal space and a shallow height. Thus, the case 110 may have an opened front surface 111, an opened rear surface 112, two side surfaces 115, an upper surface 113 and a lower surface 114. The side surfaces 115 may have a height less than a width and a length of the upper surface 113. The side surfaces 115 may have a rounded shape toward an outside of the case 110. Alternatively, the side surfaces 115 may have a vertical planar shape. Particularly, the side surfaces 115 may be integrally formed with the upper surface 113 and the lower surface 114 so that the case 110 may have one body. The case 110 may be formed by an extrusion process.

The case 110 may include a window 116. The window 116 may be formed through the upper surface 113 of the case 110. The LED module 150 and the fingerprint sensor 140 may be exposed through the window 116. In some example embodiments, the window 116 may be arranged within a region having a length of about 10% to about 90% of a length of the upper surface 113 of the case 110. That is, a position of the window 116 may not be restricted within a specific region of the upper surface 113 of the case 110.

The SSD 120 may be arranged in the case 110. The SSD 120 may be attached to the lower surface 114 of the case 110. In order to reduce a transfer of an external impact to the SSD 120 through the case 110, a cushion 126 may be interposed between the SSD 120 and the lower surface 114 of the case 110.

The SSD 120 may include a first connector 122 and a second connector 124. The SSD 120 may be electrically connected with an external device through the first connector 122. The first connector 122 may include a USB connector. The SSD 120 may be electrically connected with the LED module 150 and the fingerprint sensor 140 through the second connector 124. In some example embodiments, the first connector 122 may be installed at a central portion of front end of an upper surface of the SSD 120 adjacent to the front surface 111 of the case 110. The second connector 124 may be installed at a side of the first connector 122.

The LED module 150 may be arranged in the case 110. The LED module 150 may be configured to indicate operations of the SSD 120. That is, when the SSD 120 may be operated, the LED module 150 may generate (e.g., emit) a light that indicates operations of the SSD 120. The LED module 150 may be attached to an inner portion of the upper surface 113 of the case 110 configured to surround the window 116 using an adhesive 134.

The LED module 150 may be attached to a printed circuit board (PCB) 130 using the adhesive 134. The PCB 130 may include a third connector 138 connected with the PCB 130 via a flexible cable 132. The third connector 138 may be connected to the second connector 124 of the SSD 120. A cushion 136 may be interposed between the PCB 130 and the upper surface 113 of the case 110.

The fingerprint sensor 140 may be mounted on the PCB 130. The fingerprint sensor 140 may be combined with the LED module 150. The fingerprint sensor 140 may be received in a central portion of the LED module 150. The fingerprint sensor 140 may be configured to recognize a fingerprint of a user so as to a security of the SSD 120.

The main bracket 160 may be arranged in the case 110 to support the LED module 150 and the fingerprint sensor 140. In some example embodiments, the main bracket 160 may be configured to upwardly support a lower surface of the PCB 130 with the LED module 150 and the fingerprint sensor 140. The main bracket 160 may enter into the case 110 through the opened rear surface 112 of the case 110 in a first direction. That is, the first direction may correspond to an entering direction of the main bracket 160 into the case 110. Particularly, the main bracket 160 may be inserted into the case 110 with the main bracket 160 being slidably contacted with the lower surface of the PCB 130. A sheet 166 may be attached to a rear surface of the main bracket 160.

A thermal pad 168 may be interposed between the main bracket 160 and the SSD 120. The thermal pad 168 may be configured to transfer a heat generated from the SSD 120 to the case 110 through the main bracket 160. Thus, the thermal pad 168 may be configured to make contact with the lower surface of the main bracket 160 and the upper surface of the SSD 120.

The front bracket 180 may be arranged in the case 110 to support the second connector 124 and the third connector 138. As shown in FIG. 9, the front bracket 180 may downwardly compress an upper surface of the third connector 138. The front bracket 180 may be inserted into the case 110 through the opened front surface 111 of the case 110 in a second direction. That is, the second direction may be opposite to the first direction. The second direction may correspond to an entering direction of the front bracket 180 into the case 110. A cushion 182 may be interposed between the front bracket 180 and the upper surface of the third connector 138. A sheet 184 may be attached to a front surface of the front bracket 180.

Figure 3:
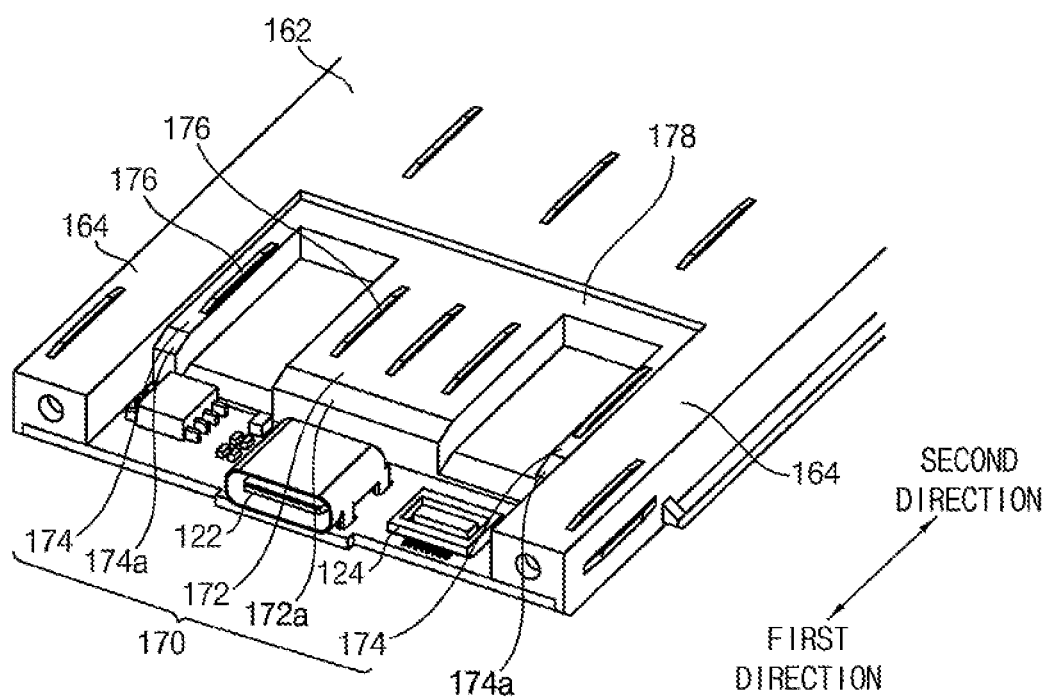
Figure 4:
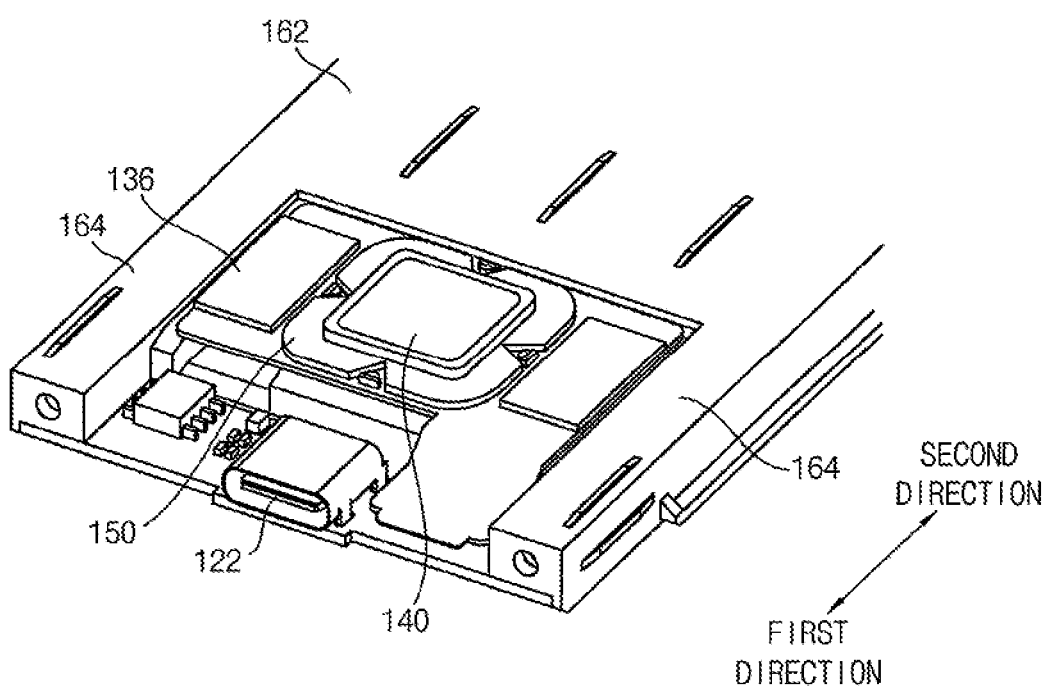
Figure 5:
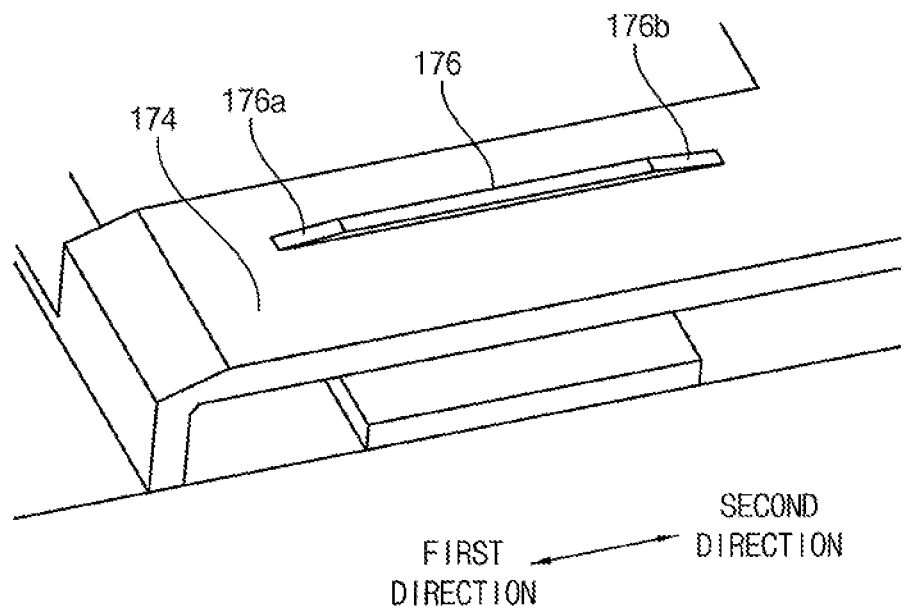

FIG. 3 is an enlarged perspective view illustrating a main bracket of the portable SSD module in FIG. 1, FIG. 4 is a perspective view illustrating an LED module supported by the main bracket in FIG. 3, and FIG. 5 is an enlarged perspective view illustrating a rib of the main bracket in FIG. 3.

Referring to FIGS. 3 to 5, the main bracket 160 may include a body portion 162, a pair of horizontal supporting portion 164 and a vertical supporting portion 170.

The body portion 162 may have a rectangular plate shape. The body portion 162 may be arranged between the case 110 and the SSD 120, particularly, the upper surface 113 of the case 110 and the thermal pad 168. The body portion 162 may have an upper surface higher than the lower surface of the LED module 150, particularly, the lower surface of the PCB 130.

The horizontal supporting portions 164 may be extended from both side portions of a front surface of the body portion 162 in the first direction. The vertical supporting portion 170 may be arranged between the horizontal supporting portions 164. That is, the vertical supporting portion 170 may be extended from a central portion of the front surface of the body portion 162 in the first direction. A length of the vertical supporting portion 170 in the first direction may be shorter than a length of the horizontal supporting portions 164 in the first direction. Thus, a space defined by inner surfaces of the vertical supporting portion 170 and the horizontal supporting portions 164 may be formed. The first connector 122 and the second connector 124 of the SSD 120 may be upwardly exposed through the space. That is, front surfaces of the horizontal supporting portions 164 and the vertical supporting portion 170 may be positioned between the first connector 122 and a bridge IC of the SSD 120.

The vertical supporting portion 170 may have an upper surface lower than upper surfaces of the body portion 162 and the horizontal supporting portions 164. Thus, an upper portion of the front surface of the body portion 162 and upper portions of the inner surfaces of the horizontal supporting portions 164 may be exposed to form a receiving groove 178 defined by the upper portion of the front surface of the body portion 162, the upper portions of the inner surfaces of the horizontal supporting portions 164 and the upper surface of the vertical supporting portion 170. The PCB 130 with the LED module 150 and the fingerprint sensor 140 may be received in the receiving groove 178. That is, the vertical supporting portion 170 may have a height less than a height of the body portion 162 due to the receiving groove 178 so that the vertical supporting portion 170 may be configured to support the PCB 130 with the fingerprint sensor 140.

In some example embodiments, a sum of the height of the vertical supporting portion 170 and the height of the fingerprint sensor 140 may be greater than the height of the body portion 162. Further, the sum of the height of the vertical supporting portion 170 and the height of the fingerprint sensor 140 may be about 90% to about 110% of a height from the PCB 130 to the upper surface 113 of the case 110.

Therefore, the inner surfaces of the horizontal supporting portions 164 may be configured to support both side surfaces of the PCB 130 in the receiving groove 178. The vertical supporting portion 170 may be configured to support the lower surface of the PCB 130. Further, as mentioned above, because the upper surface of the body portion 162 may be higher than the lower surface of the PCB 130, the exposed upper portion of the front surface of the body portion 162 may be configured to support the rear surface of the PCB 130.

The vertical supporting portion 170 may include a central supporting portion 172 and a pair of edge supporting portions 174. The central supporting portion 172 may be arranged at a central portion of the receiving groove 178 to support a central portion of the lower surface of the LED module, particularly, a central portion of the lower surface of the PCB 130. The edge supporting portions 174 may be arranged in both edge portions of the receiving groove 178 at both sides of the central supporting portion 172 to support edge portions of the lower surface of the PCB 130. Thus, a space may be formed between the central supporting portion 172 and the edge supporting portions 174. Electronic components, which may be mounted on the lower surface of the PCB 130 to control the LED module 150 and the fingerprint sensor 140, may be received in the space.

Ribs 176 may be formed on upper surfaces of the central supporting portion 172 and the edge supporting portions 174 in the first direction. Each of the ribs 176 may include a first slant surface 176a. The first slant surface 176a may be downwardly slantly formed on a front end of the rib 176 in the first direction. When the main bracket 160 may be inserted through the opened rear surface 112 of the case 110 in the first direction, the front end of the rib 176 may firstly make contact with the rear surface of the PCB 130. Because the first slant surface 176a may be formed on the front end of the rib 176, the lower surface of the PCB 130 may slidably make contact with the first slant surface 176a. Thus, an interference may not be generated between the main bracket 160 and the LED module 150, particularly, the main bracket 160 and the PCB 130. As a result, the main bracket 160 may be readily combined with the case 110.

Additionally, each of the ribs 176 may further include a second slant surface 176b. The second slant surface 176b may be downwardly slantly formed on a rear end of the rib 176 in the second direction.

Further, slant surfaces 172a and 174a may be formed at the front portions of the upper surfaces of the central supporting portions 172 and the edge supporting portions 174. The slant surfaces 172a and 174a may be downwardly slantly formed along the first direction. Thus, because the slant surfaces 172a and 174a may function as to remove angular structures of the upper ends of the front surfaces of the central supporting portion 172 and the edge supporting portions 174, the upper ends of the front surfaces of the central supporting portion 172 and the edge supporting portions 174 may not collide against the PCB 130.

Figure 6:
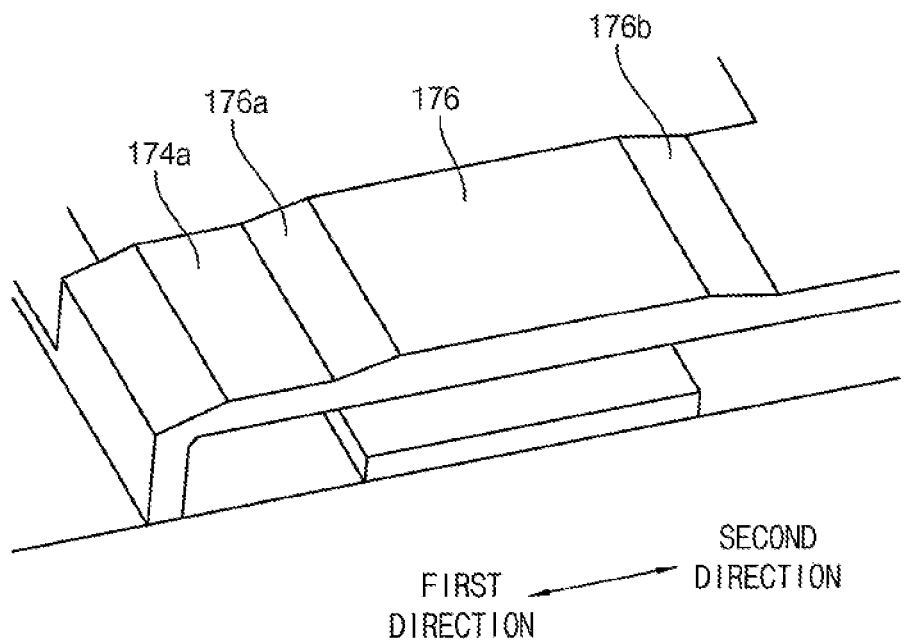

FIG. 6 is a perspective view illustrating a main bracket of a portable SSD module in accordance with some example embodiments.

Referring to FIG. 6, a main bracket 160a of some example embodiments may not include a rib. The vertical supporting portion 170 of the main bracket 160a may have a slant upper surface in place of the rib. That is, the central supporting portion 172 and the edge supporting portions 174 of the vertical supporting portion 170 may include slant upper surfaces 172a and 174a. Because the slant upper surfaces 172a and 174a may have a structure and a function substantially the same as those of the rib 176, the structure and the function of the slant upper surfaces 172a and 174a may be omitted herein for brevity.

Figure 7:
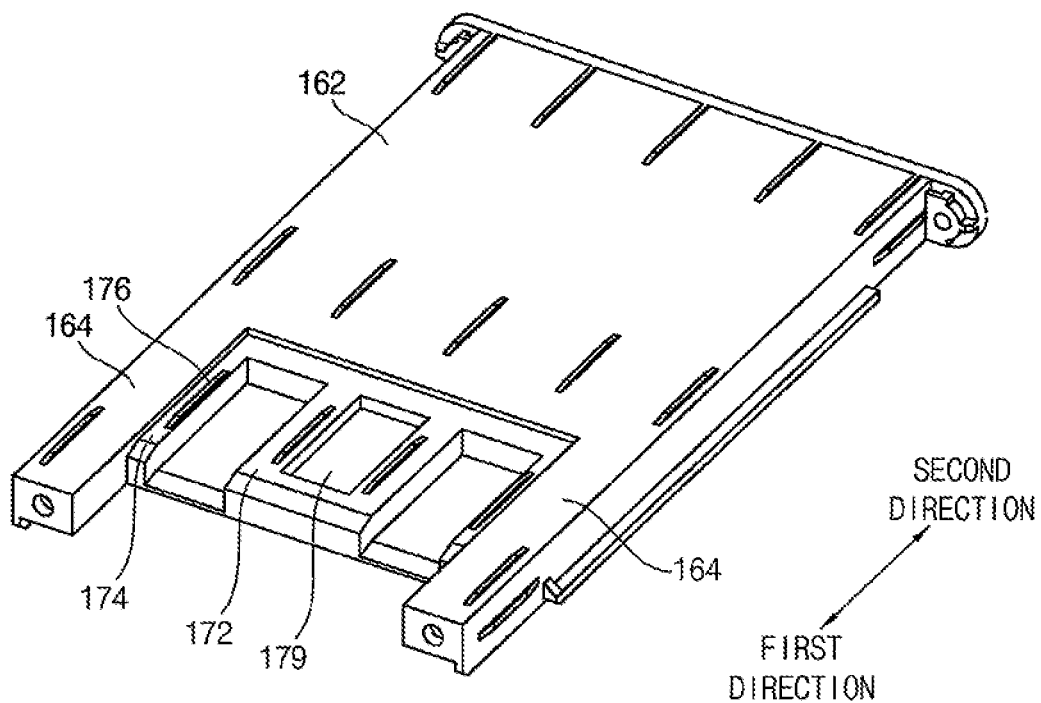
Figure 8:
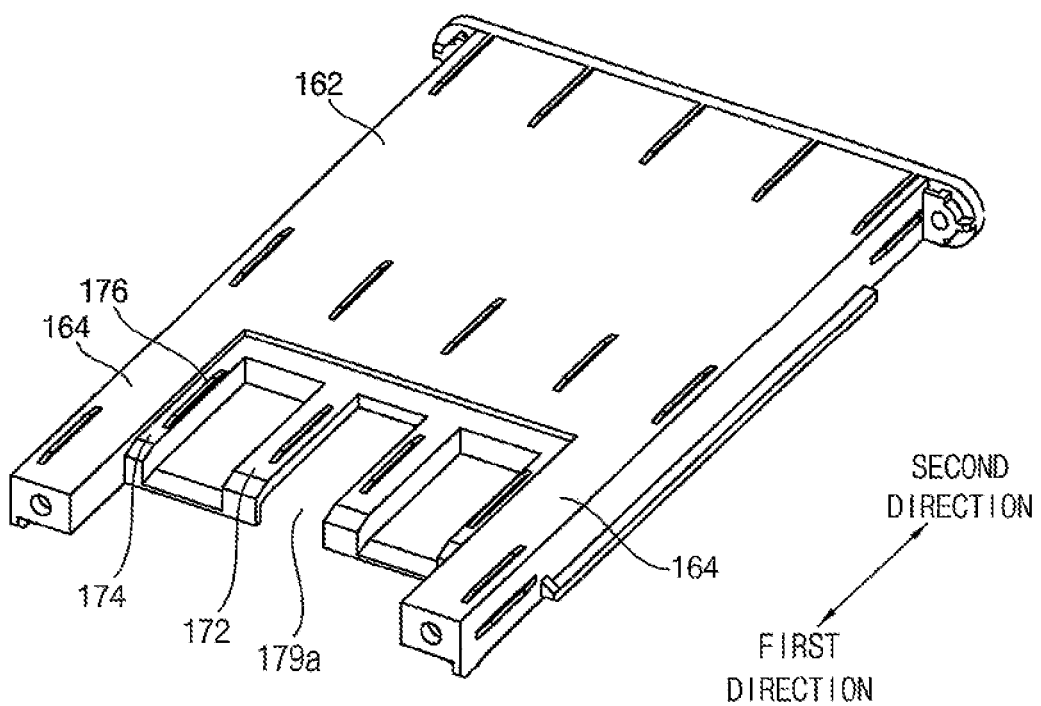

FIGS. 7 and 8 are perspective views illustrating main brackets of a portable SSD module in accordance with some example embodiments.

Referring to FIG. 7, an opening 179 may be formed through the central supporting portion 172. Alternatively, referring to FIG. 8, an opening 179a having an opened front surface may be formed through the central supporting portion 172. The electronic components on the lower surface of the PCB 130 or the SSD 120 may be received in the openings 179 or 179a.

Figure 10:
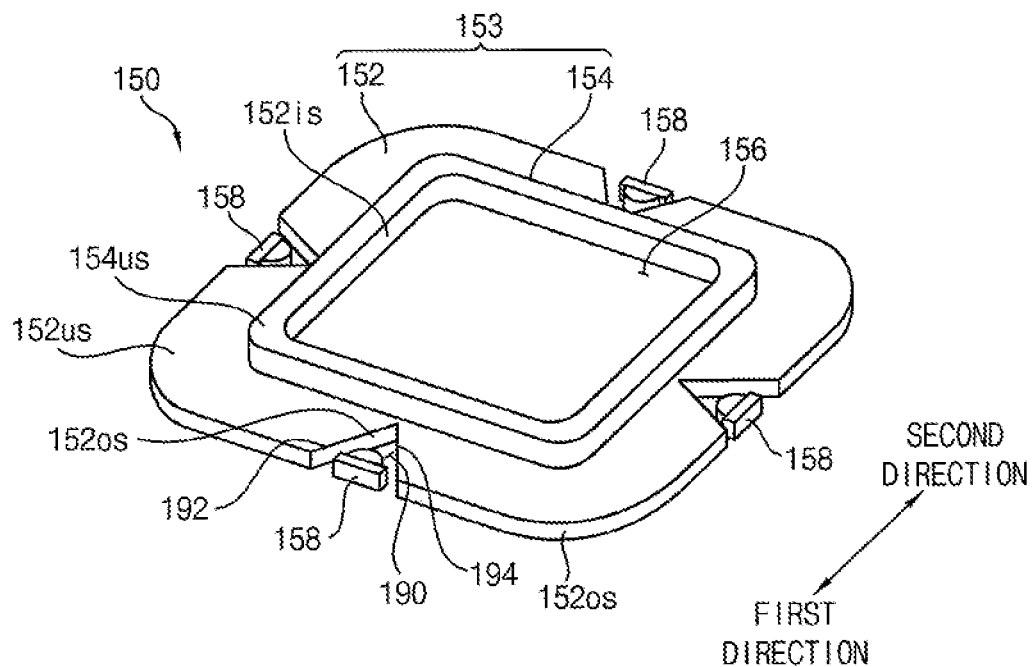
Figure 11:
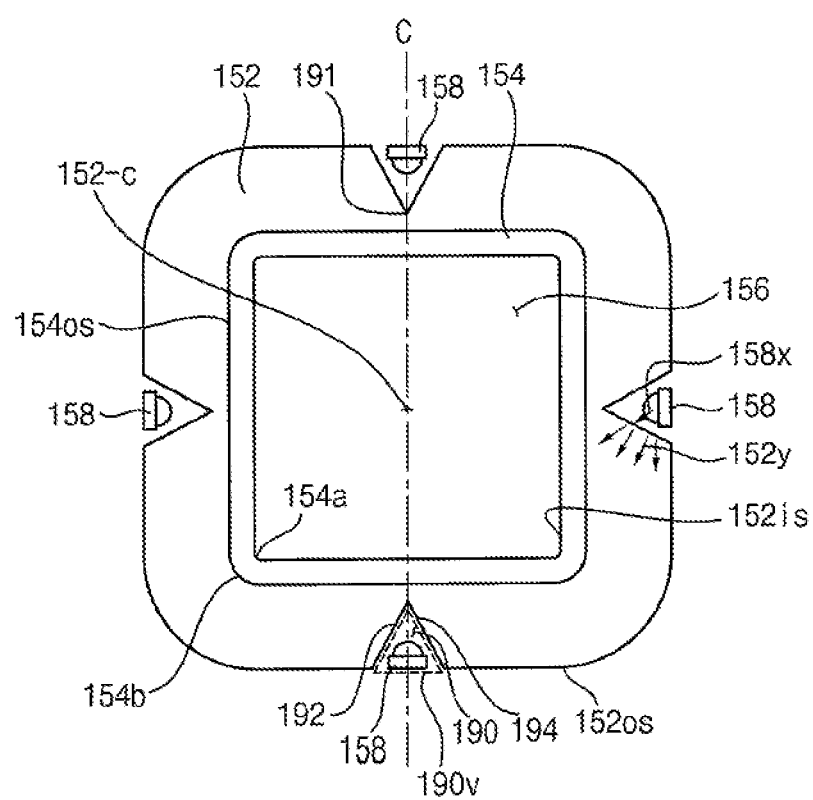

FIG. 10 is an enlarged perspective view illustrating an LED module of the portable SSD module in FIG. 1, and FIG. 11 is a plan view illustrating the LED module in FIG. 10.

Referring to FIGS. 10 and 11, the LED module 150 may include at least one LED 158 and an indicator 153. FIGS. 10-11 illustrate an LED module 150 including four LEDs 158, but it will be understood that in some example embodiments an LED module 150 may include a single, individual LED 158 instead of multiple LEDs 158. In some example embodiments the LED module 150 may include two or more LEDs 158. In some example embodiments, an LED as described herein (e.g., any or all of LEDs 158 as described herein) may be a Light-Emitting Diode under the well-known meaning of the term and may include any or all well-known elements of Light-Emitting Diodes, such that an LED module that includes at least one Light-Emitting Diode LED 158 may be understood to be a Light-Emitting Diode Module under the well-known meaning of the term and may include any or all well-known elements of Light-Emitting Diode Modules. It will be understood that an LED 158 as described herein may include a light-emitting device that is different from a Light-Emitting Diode, for example LED 158 may be any well-known device configured to emit light based on an electric current being passed through any portion thereof (e.g., due to electroluminescence), for example a laser diode. The indicator 153 may include an indicating plate 152 and an indicating channel 154 arranged at a central portion of the indicating plate 152.

In some example embodiments, the indicating plate 152 may have a rectangular shape, particularly, a square shape. The indicating plate 152 may have rounded corners. However, the indicating plate 152 may have other shapes such as a circular shape, a triangular shape, a pentagonal shape, etc., in place of the square shape. The indicating plate 152 may have an opening 156, which may be defined by one or more inner surfaces 152is of the indicating plate 152. The fingerprint sensor 140 may be received in the opening 156. Because the fingerprint sensor 140 may have the square shape, the opening 156 may also have a square shape. Thus, the shape of the opening 156 may be changed in accordance with the shape of the fingerprint sensor 140.

The indicating plate 152 may have (e.g., may include) at least one diffusing groove 190, where one or more outer surfaces of the indicating plate 152 facing a given LED 158, shown in FIGS. 10-11 as diffusing surfaces 192 and 194, define the diffusing groove 190. The LED 158 may be received in (e.g., located in) the diffusing groove 190, such that the LED 158 is partially or entirely located within a volume space 190V that is at least partially defined by the diffusing surfaces 192 and 194. The volume space 190V may be further defined by one or more outer surfaces 152os of the indicating plate 152 as shown in FIGS. 10-11, and each LED 158 may be partially or entirely within separate, respective volume spaces 190V as shown, but example embodiments are not limited thereto and the LED 158 may, in some example embodiments, be located in a volume space 190V that is at least partially defined by diffusing surfaces 192 and 194 and extends beyond a boundary defined by the one or more outer surfaces 152os. A light emitted from the LED 158 may diffuse into an interior of the indicator 153 (e.g., the interior of the indicating plate 152) through the diffusing groove 190. Restated, the diffusing groove 190 may be configured to diffuse a light beam (e.g., a light) emitted from the LED 158 towards the diffusing groove 190. The diffusing groove 190 may have an angular shape including at least two diffusing surfaces 192 and 194 configured to diffuse the light. It will be understood that diffusing light includes scattering or diffusing a light beam received at a surface of ab object to propagate in multiple directions simultaneously upon passing through the surface into the interior of the object, where such diffusion may be based on the angle range of the surface and/or the material composition of the object. For example, as further described below, the diffusing groove 190 may be configured, based on the angle range of the diffusing groove 190, for example based on the angle of the one or more diffusing surfaces 192 and 194 in relation to the orientation of the LED 158 located in the volume space 190V defined by said one or more diffusing surfaces 192 and 194, to receive an incident light beam 158x emitted by the LED 158 and incident on the one or more diffusing surfaces 192 and 194 and cause the incident light beam 158x to be scattered 158y by the one or more diffusing surfaces 192 and 194 into the interior of the indicator 153 (e.g., the interior of the indicating plate 152) as shown. Accordingly, it will be understood that a diffusing surface of a diffusing groove 190 as described herein may be configured to diffuse light emitting by an LED 158 received in said diffusing groove 190 based on the angle of the diffusing surface in relation to the orientation of the LED 158 in the diffusing groove 190. It will be understood that in some example embodiments the diffusing groove 190 may be defined by a single diffusing surface that is at least partially curved (e.g., diffusing surfaces 192 and 194 may be part of a singular, continuous surface that curves at vertex 191.

In some example embodiments, a diffusing groove 190 is formed at an outer surface 152os of the indicating plate 152 such that the one or more diffusing surfaces of the diffusing groove 190 define at least a portion of an outer boundary of the indicating plate 152. In some example embodiments, including the example embodiments shown in FIGS. 10-11, the diffusing groove 190 may include four diffusing grooves 190 formed at four outer surfaces 152os of the indicating plate 152, respectively, such that the diffusing surfaces 192 and 194 of the diffusing grooves 190 are portions of the respective outer surfaces 152os of the indicating plate 152. Thus, the four LEDs 158 may be arranged in the four diffusing grooves 190, respectively. However, the diffusing groove 190 may be formed at any one, two surfaces or three surfaces of the four outer surfaces 152os of the indicating plate 152.

The indicating channel 154 may be arranged along one or more inner surfaces 152is of the indicating plate 152 that defines the opening 156, where the inner surface(s) 152is may also be referred to as inner surface(s) of the opening 156. As shown, the indicating channel 154 may be arranged at a central portion of the indicating plate 152, for example such that a center 152-C of the indicating plate 152 is located within the opening 156 and/or is at a same location as a center of the indicating channel 154, but example embodiments are not limited thereto, and in some example embodiments the center of the indicating channel 154 and the center 152-C of the indicating plate 152 may be horizontally offset from each other. Because the opening 156 may have the square shape, the indicating channel 154 may have a square frame shape. Thus, the indicating channel 154 may have an inner corner 154a and an outer corner 154b. As shown in FIGS. 10-11, the indicating channel 154 may have a rectangular frame shape having four inner corners 154a and four outer corners 154b, but example embodiments are not limited thereto.

The indicating channel 154 may have an upper surface 154us higher than an upper surface 152us of the indicating plate 152. The indicating plate 152 may be configured to make contact with the upper surface 113 of the case 110 so that only the indicating channel 154 may be exposed through the window 116. The indicating channel 154 may have an outer surface 154os configured to make contact with the inner surface of the window 116. Thus, the user may recognize only the light diffused through the indicating channel 154. Therefore, the diffusing groove 190 may be provided with a structure for uniformly diffusing the light into the indicating channel 154. Particularly, the diffusing groove 190 may be provided with a structure for more diffusing the light into the inner corner 154a and the outer corner 154b of the indicating channel 154.

In some example embodiments, the diffusing groove 190 may be positioned on a center line C crossing a central portion of the indicating plate 152 (e.g., a center 152-C of the indicating plate 152). That is, as shown in at least FIGS. 12-13, the diffusing groove 190 may be formed at a central portion 152os-C of an outer surface 152os of the indicating plate 152. Further, the diffusing groove 190 may have an isosceles triangular shape that is at least partially defined by two diffusing surfaces that have the same length or substantially the same length. Thus, the diffusing groove 190 may include the two diffusing surfaces 192 and 194 having a same length or substantially same length. The diffusing groove 190 may have a vertex 191 positioned on the center line C of the indicating plate 152 so that a distance between the diffusing surface 192 and a left corner of the indicating channel 154 may be substantially the same as a distance between the diffusing surface 194 and a right corner of the indicating channel 154. The diffusing surfaces 192 and 194 may be configured to diffuse the light toward the both corners of the indicating channel 154. Thus, the light may be uniformly distributed in the indicating channel 154. Accordingly, the indicating channel 154 may be configured to emit the light emitted from the LED 158 and diffused into the interior of the indicator 153 (e.g., the interior of the indicating plate 152) to an exterior of the LED module 150 (e.g., in a direction that is normal to the upper surface 154us of the indicating channel 154.

In some example embodiments, the indicating channel 154 and/or the indicating plate 152 having one or more diffusing grooves 190 may be omitted from the indicator 153.

It will be understood that lengths, distances, or the like described herein as being the "substantially" the same encompasses lengths, distances, or the like that are the same within manufacturing tolerances and/or material tolerances and/or lengths, distances, or the like that have a relative difference in magnitude that is equal to or less than 10%.

Figure 12:
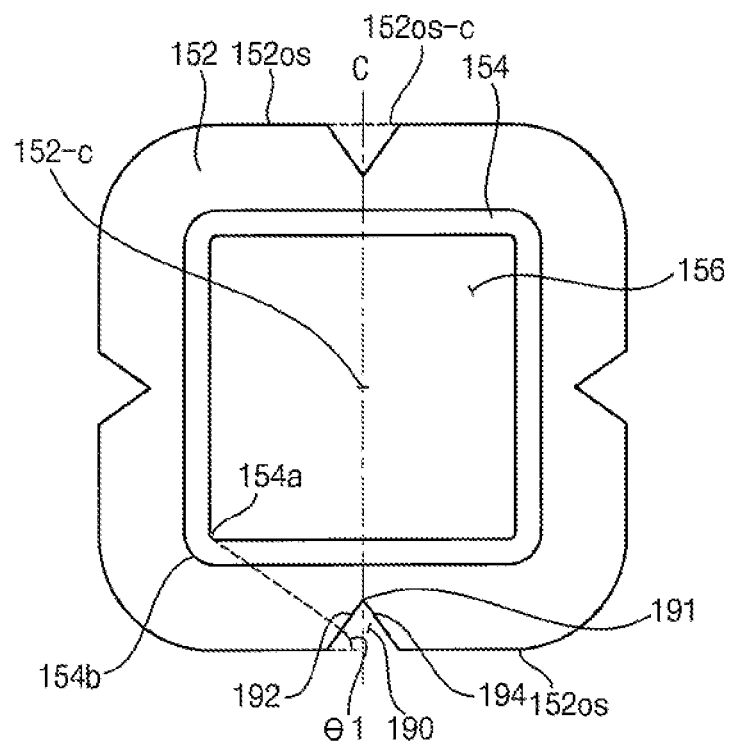
Figure 13:
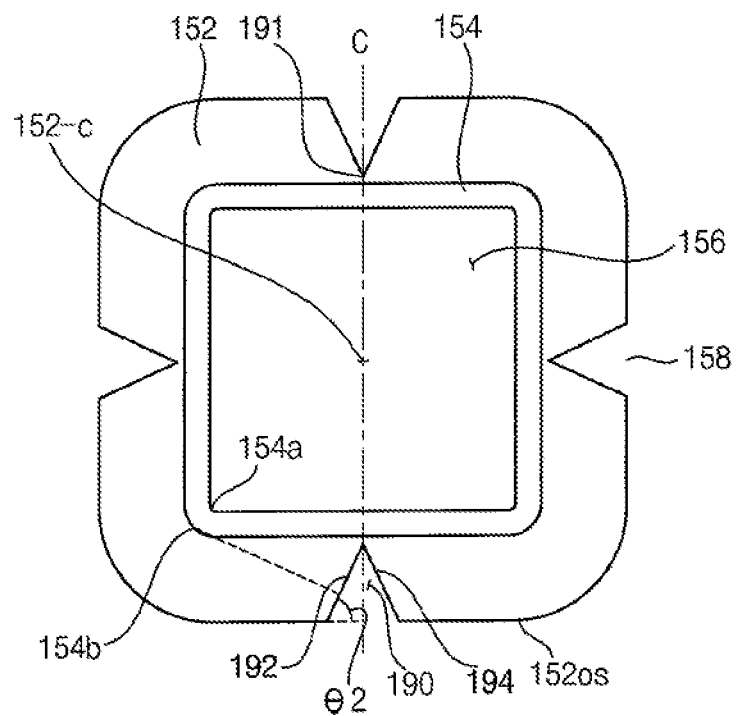

FIGS. 12 and 13 are plan views illustrating an angle range of a diffusing groove of the LED module in FIG. 11.

Referring to FIG. 12, when the light vertically passing through the central portion of the diffusing surface 192 of the diffusing groove 190 (e.g., pass through a central portion of the diffusing groove 190) may reach to the inner corner 154a of the indicating channel 154 and thus may be incident to the inner corner 154a, a first angle between the diffusing groove 190 and the outer surface of the indicating plate 152 may be θ1. Restated, the first angle θ1 may be defined by incident light (e.g., as 158x) that is incident on, and passes through, the central portion of the diffusing groove 190 (e.g., a central portion of diffusing surface 192 as shown) and is incident (e.g., at least a portion of 158y) to any one of the inner corners 154a. When the first angle may be below the θ1, the light vertically passing through the central portion of the diffusing surface 192 may be incident to the opening 156 through the inner corner 154a.

Referring to FIG. 13, when the light vertically passing through the central portion of the diffusing surface 192 of the diffusing groove 190 (e.g., pass through a central portion of the diffusing groove 190) may reach to the outer corner 154b of the indicating channel 154 and thus may be incident to the outer corner 154b, a second angle between the diffusing groove 190 and the outer surface of the indicating plate 152 may be θ2. Restated, the second angle θ2 may be defined by incident light (e.g., as 158x) that is incident on, and passes through, the central portion of the diffusing groove 190 190 (e.g., a central portion of diffusing surface 192 as shown) and is incident (e.g., at least a portion of 158y) to any one of the outer corners 154b. When the second angle may be above the θ2, the light vertically passing through the central portion of the diffusing surface 192 may be incident into the indicating plate 152 through the outer corner 154b.

Therefore, in some example embodiments, including example embodiments wherein the indicating channel 154 includes a rectangular frame shape having four inner corners 154a and four outer corners 154b, an slant angle of the diffusing groove 190 with respect to the outer surface 152os of the indicating plate 152 may have a range between the first angle θ1 for allowing the light, which may vertically pass through the central portion of the diffusing groove 190, to be incident to the inner corner 154a of the indicating channel 154 and the second angle θ2 for allowing the light to be incident to the outer corner 154b of the indicating channel 154. Restated, the slant angle of the diffusion groove with respect to the outer surface 152os of the indicating plate may have a range between the first angle θ1 as defined herein and the second angle θ2 as defined herein.

Figure 14:
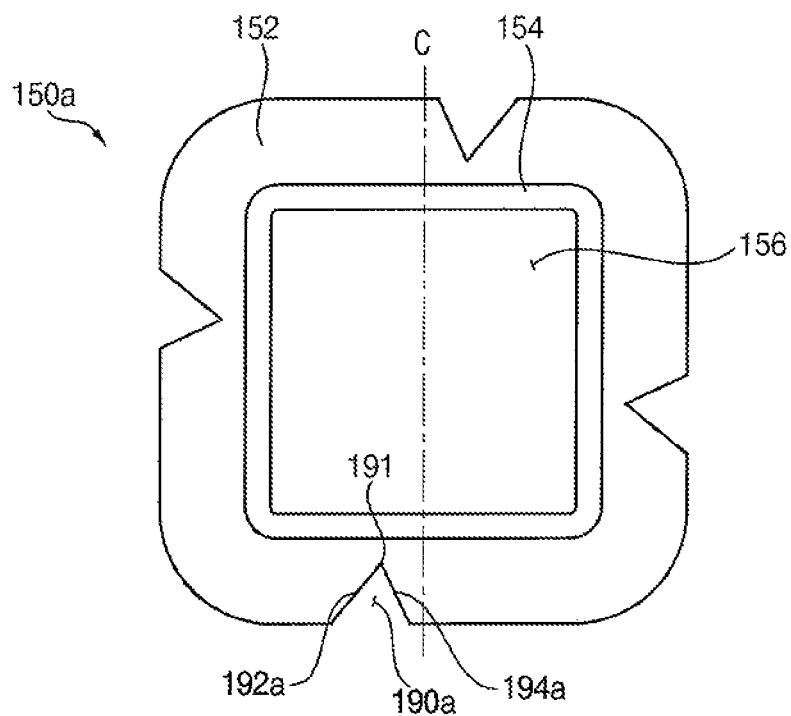

FIG. 14 is a plan view illustrating an LED module in accordance with some example embodiments.

Referring to FIG. 14, an LED module 150a of some example embodiments may include a diffusing groove 190a. The diffusing groove 190a may include a first diffusing surface 192a and a second diffusing surface 194a having different lengths. The diffusing groove 190a may be formed at a portion of the outer surface of the indication plate 152 offset from the center line C crossing the central portion (e.g., the center 152-C) of the indication plate 152, for example such that the diffusing groove 190 does not intersect with the center line C at all and/or that vertex 191 is not on the center line C. Accordingly, as shown in FIG. 14, the diffusing groove 190 may be located at a position that is offset from a center line C that extends normal to the outer surface 152os and intersects the center 152-C of the indicating plate 152. Thus, a distance between the first diffusing surface 192a and the corner of the indicating channel 154 adjacent to the first diffusing surface 192a may be different from a distance between the second diffusing surface 194a and the corner of the indicating channel 154 adjacent to the second diffusing surface 194a.

In some example embodiments, the diffusing groove 190a may be arranged at a left portion of the center line C. Thus, the distance between the first diffusing surface 192a and the corner of the indicating channel 154 may be shorter than the distance between the second diffusing surface 194a and the corner of the indicating channel 154. In order to induce the light, which may vertically pass through central portions of the first diffusing surface 192a and the second diffusing surface 194a, to the adjacent corners of the indicating channel 154, a first slant angle θ1 of the first diffusing surface 192a with respect to the outer surface of the indicating plate 152 may be less than a second slant angle θ2 of the second diffusing surface 194a with respect to the outer surface of the indicating plate 152. That is, the length of the first diffusing surface 192a may be longer than the length of the second diffusing surface 194a.

Alternatively, in contrast, the diffusing groove 190a may be arranged at a right portion of the center line C. Thus, a distance between the first diffusing surface 192a and the corner of the indicating channel 154 may be longer than a distance between the second diffusing surface 194a and the corner of the indicating channel 154. In order to induce the light, which may vertically pass through central portions of the first diffusing surface 192a and the second diffusing surface 194a, to the adjacent corners of the indicating channel 154, a first slant angle θ1 of the first diffusing surface 192a with respect to the outer surface of the indicating plate 152 may be greater than a second slant angle θ2 of the second diffusing surface 194a with respect to the outer surface of the indicating plate 152. That is, the length of the first diffusing surface 192a may be shorter than the length of the second diffusing surface 194a.

Figure 15:
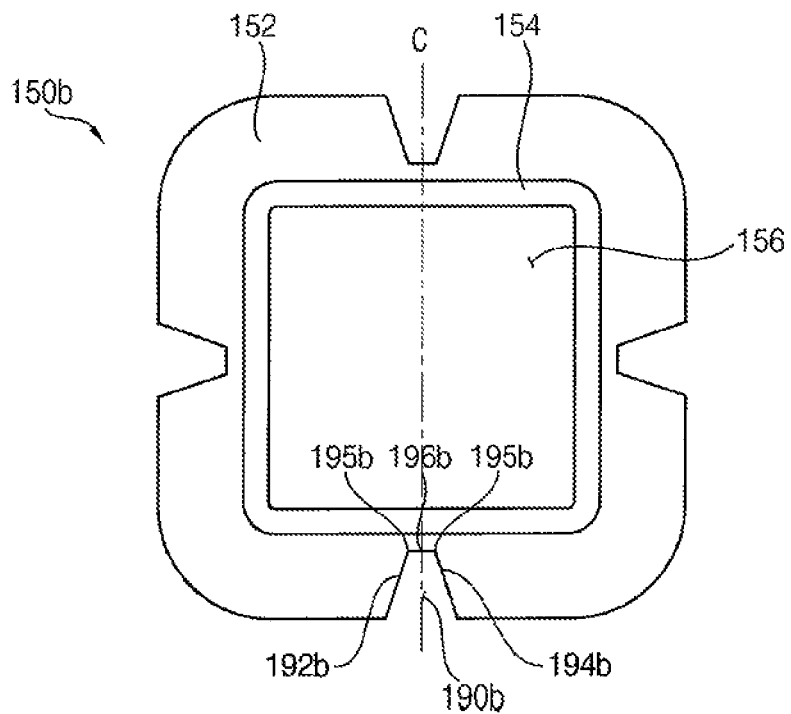

FIG. 15 is a plan view illustrating an LED module in accordance with some example embodiments.

Referring to FIG. 15, an LED module 150b of some example embodiments may include a diffusing groove 190b. The diffusing groove 190b may have an isosceles trapezoidal shape, defined by at least three diffusing surfaces 192b, 194b, 196b. The diffusing groove 190b may be positioned on the center line C crossing the central portion of the indicating plate 152.

Therefore, the diffusing groove 190b may include two first diffusing surfaces 192b and 194b having a same length or substantially a same length, and a second diffusing surface 196b connected between ends 195b (e.g., proximate edges) of the first diffusing surfaces 192b and 194b. The light may vertically pass through central portions of the first diffusing surfaces 192b and 194b. The light may then be incident to the both corners of the indicating channel 154. Further, the light may vertically pass through a central portion of the second diffusing surface 196b. The light may then be incident to the central portion of the indicating channel 154.

FIGS. 16, 17, 18, 19, and 20 are perspective views illustrating processes for combining the portable SSD module in FIG. 1.

Figure 16:
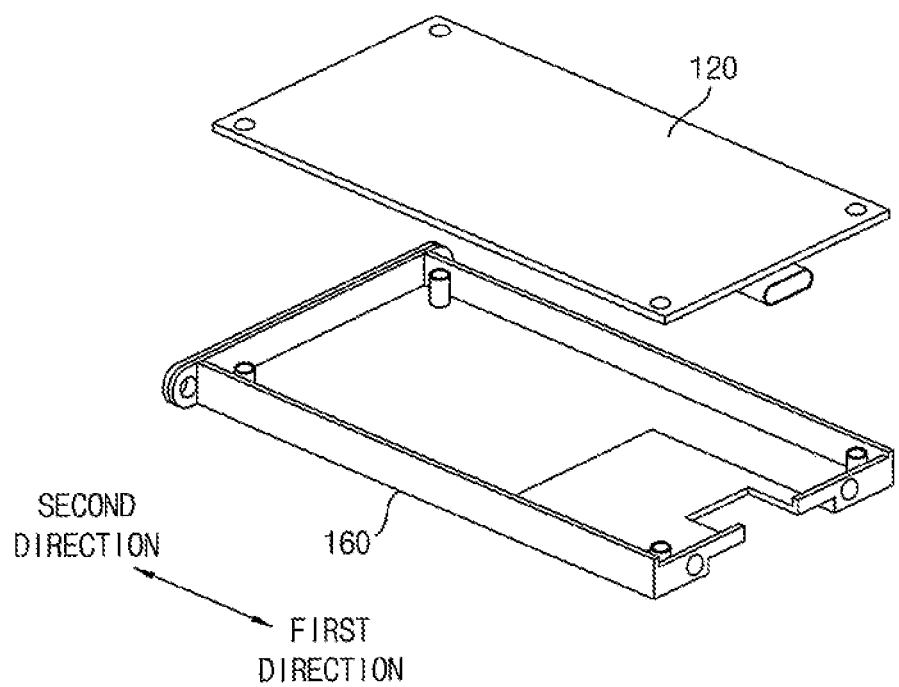

Referring to FIG. 16, the SSD 120 may be combined with the main bracket 160. Additionally, the thermal pad 168 may be interposed between the SSD 120 and the main bracket 160.

Figure 17:
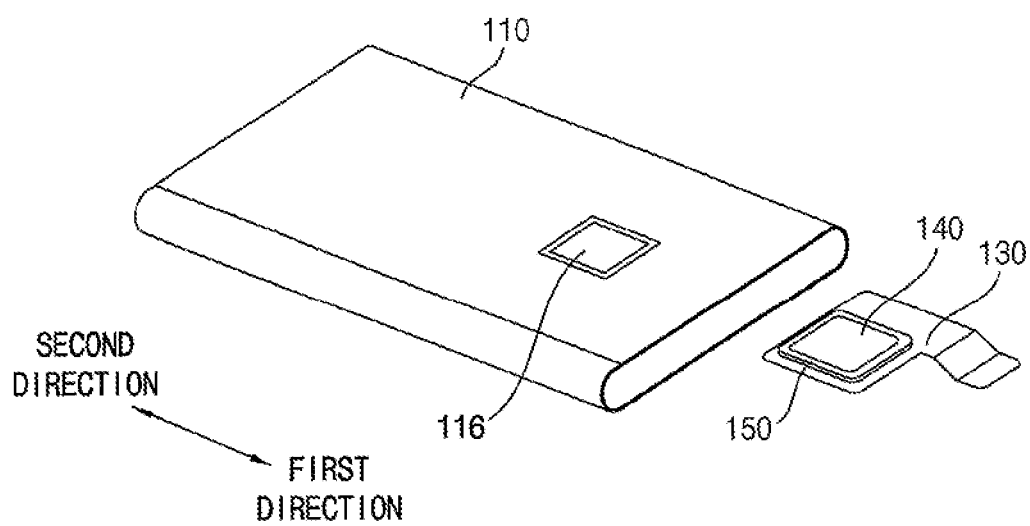

Referring to FIG. 17, the PCB 130 with the fingerprint sensor 140 and the LED module 150 may be inserted into the case 110 through the opened front surface 111 of the case 110 in the second direction. The PCB 130 may be attached to the upper surface 113 of the case 110 around the window 116 using the adhesive 134. The fingerprint sensor 140 and the LED module 150, particularly, the indicating channel 154 may be exposed through the window 116. Additionally, the cushion 136 may be interposed between the PCB 130 and the upper surface 113 of the case 110.

Figure 18:
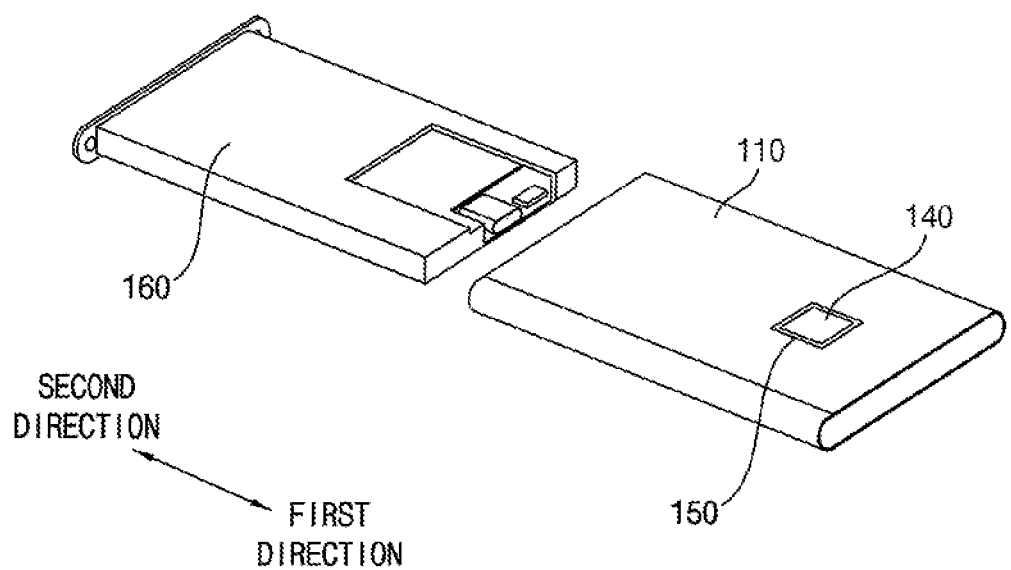

Referring to FIG. 18, the main bracket 160 with the SSD 120 may be inserted into the case 110 through the opened rear surface 112 of the case 110 in the first direction. The inclined surfaces of the ribs 176 may slidably make contact with the lower surface of the PCB 130 during inserting the main bracket 160 into the case 110.

The PCB 130 may be received in the receiving groove 178 of the main bracket 160. The both side surfaces of the PCB 130 in the receiving groove 178 may be supported by the horizontal supporting portions 164. The rear surface of the PCB 130 in the receiving groove 178 may be supported by the upper portion of the front surface of the body portion 162 in the main bracket 160. The lower surface of the PCB 130 in the receiving groove 178 may be supported by the vertical supporting portion 170. Particularly, the central supporting portion 172 of the vertical supporting portion 170 may be configured to support a central portion of the lower surface of the PCB 130. The edge supporting portions 174 of the vertical supporting portion 170 may be configured to support edge portions of the lower surface of the PCB 130.

Figure 19:
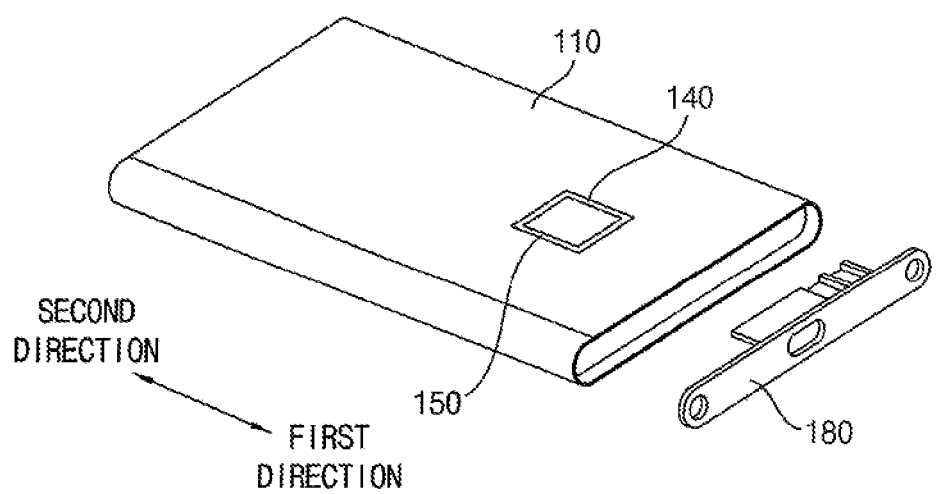

Referring to FIG. 19, the front bracket 180 may be inserted into the case 110 through the opened front surface 111 of the case 110 in the second direction. The front bracket 180 may downwardly press the connectors to support the connectors.

Figure 20:
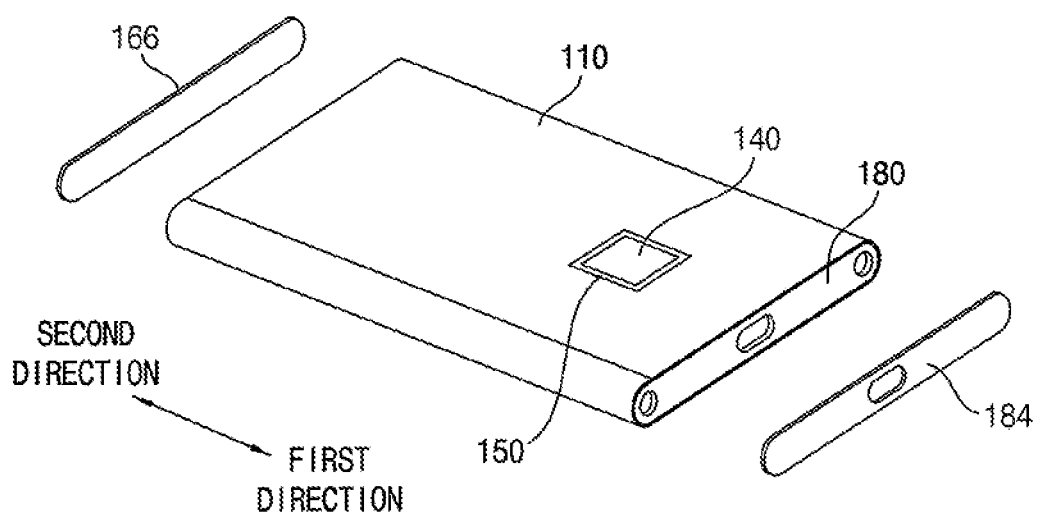

Referring to FIG. 20, the sheets 166 and 168 may be attached to the rear surface of the main bracket 160 and the front surface of the front bracket 180 to complete the portable SSD module 100 in FIG. 1.

Figure 21:
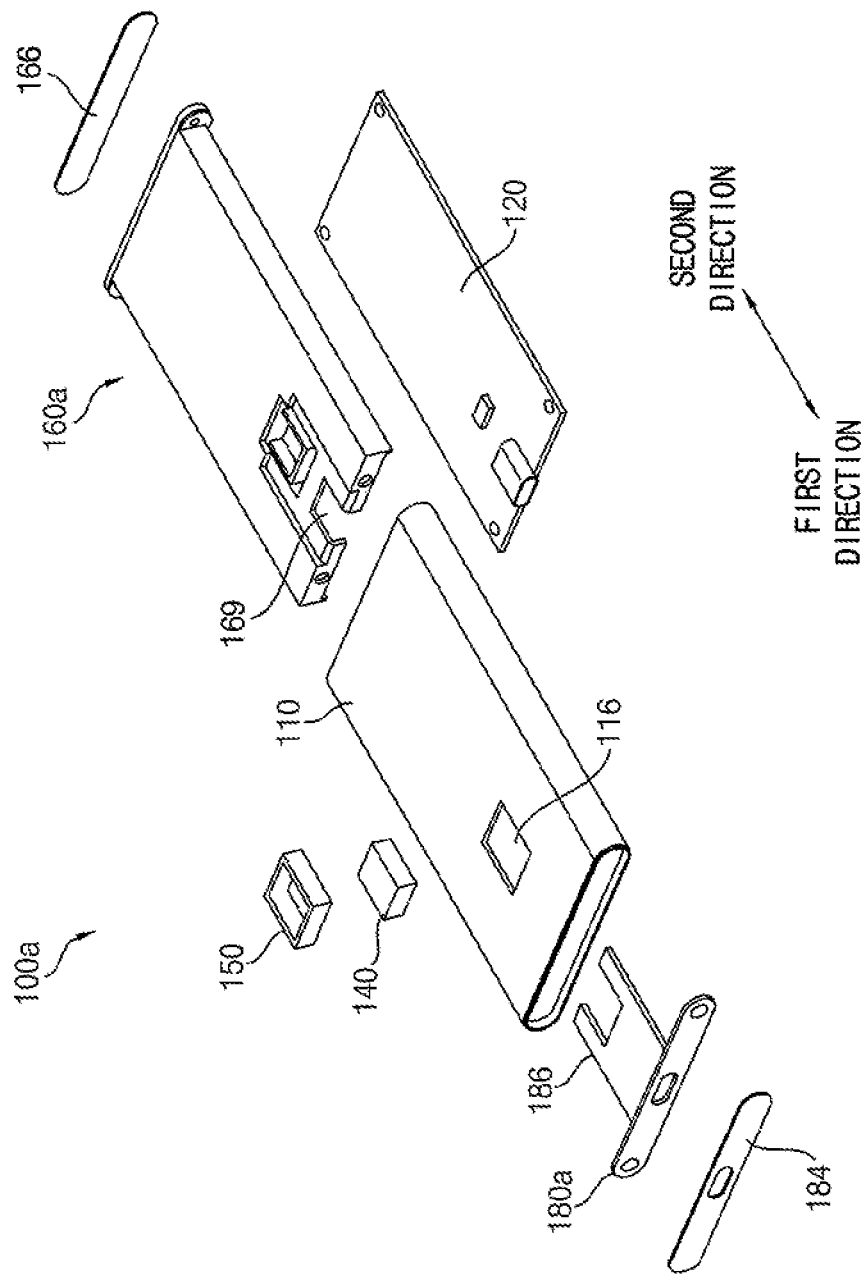
Figure 22:
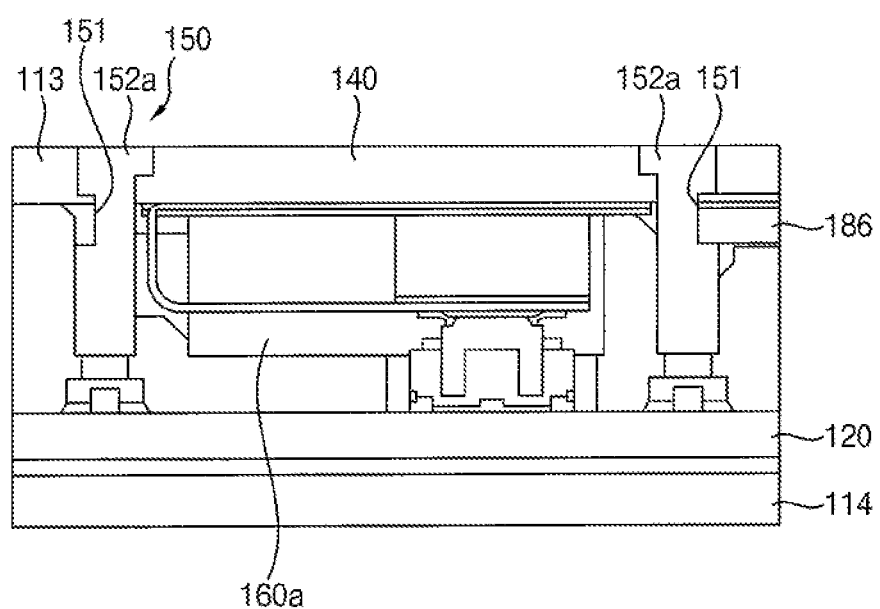

FIG. 21 is an exploded perspective view illustrating a portable SSD module in accordance with some example embodiments, and FIG. 22 is a cross-sectional view illustrating an internal structure of the portable SSD module in FIG. 21.

A portable SSD module 100a of this example embodiment may include elements substantially the same as those of the portable SSD module 100 in FIG. 1 except for a main bracket, a front bracket and an indicator. Thus, the same reference numerals may refer to the same elements and any further illustrations with respect to the same elements may be omitted herein for brevity.

Referring to FIGS. 21 and 22, the LED may be installed at the SSD 120. Thus, the portable SSD module 100a of this example embodiment may not include a PCB for driving the fingerprint sensor 140. Further, the fingerprint sensor 140 and the indicator 153 of the LED module 150 may be inserted into the case 110 through an upper surface of the window 116.

The indicator 153 may be supported by a front bracket 180a. Particularly, an indicating plate 152a may include a supporting groove 151. The front bracket 180a may include a supporting portion 186 inserted into the supporting groove 151. In contrast, a main bracket 160a may be configured to directly support the indicator 153. In order to expose the LED on the SSD 120, the main bracket 160a may have an opening 169.

In some example embodiments, the supporting groove 151 may be formed at both side surfaces of the indicating plate 152a in the second direction. The supporting portion 186 may be extended from both side portions of a rear surface of the front bracket 180a. The supporting portions 186 may be inserted into the supporting grooves 151, respectively, to support the indicator 153 by the front bracket 180a.

FIGS. 23, 24, 25, 26, 27, and 28 are perspective views illustrating processes for combining the portable SSD module in FIG. 21.

Figure 23:
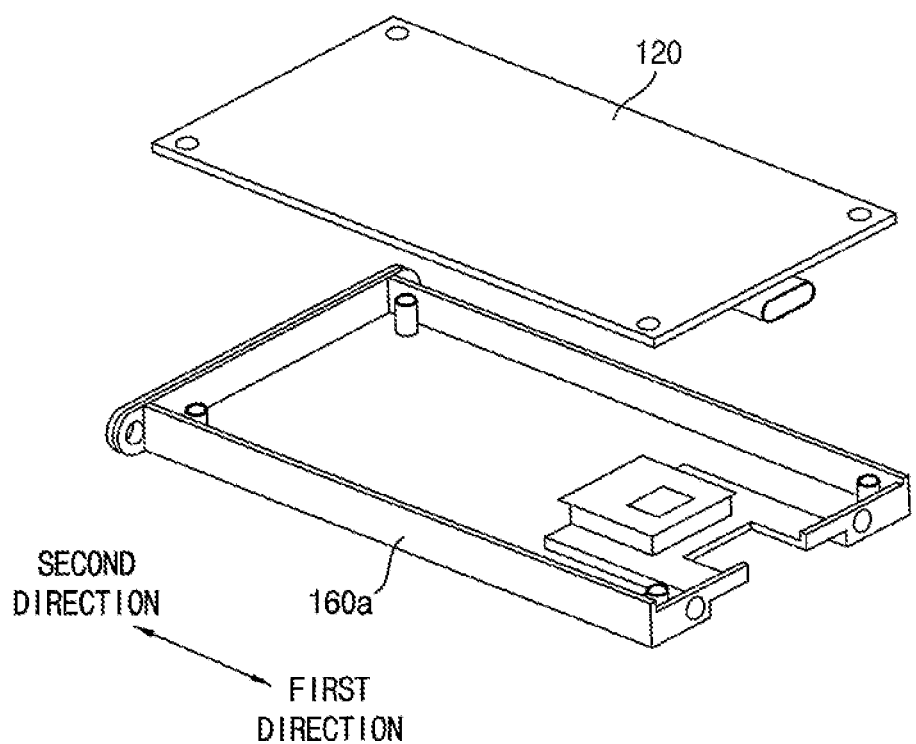

Referring to FIG. 23, the SSD 120 may be combined with the main bracket 160.

The LED may be installed at the SSD 120. Additionally, the thermal pad 168 may be interposed between the SSD 120 and the main bracket 160a.

Figure 24:
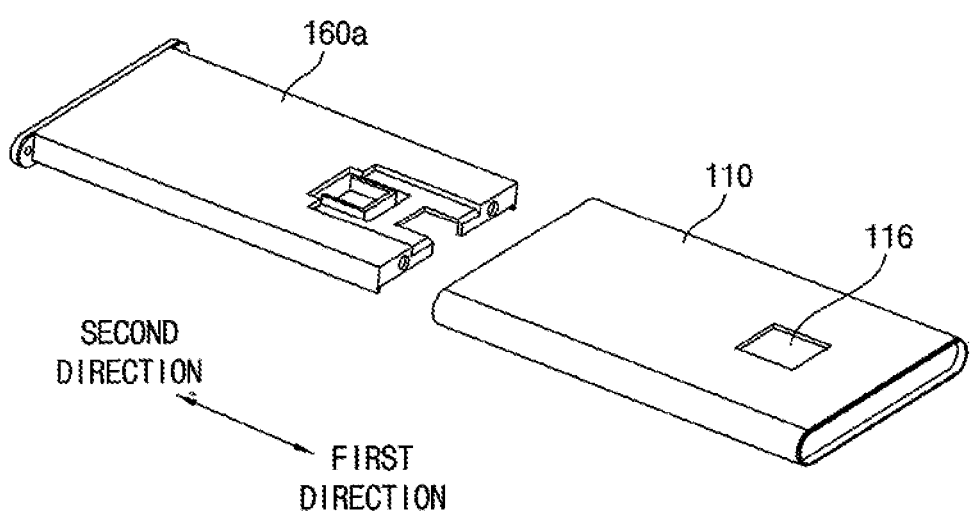

Referring to FIG. 24, the main bracket 160a with the SSD 120 may be inserted into the case 110 through the opened rear surface 112 of the case 110 in the first direction. The LED on the SSD 120 may be exposed through the opening 169 of the main bracket 160a.

Figure 25:
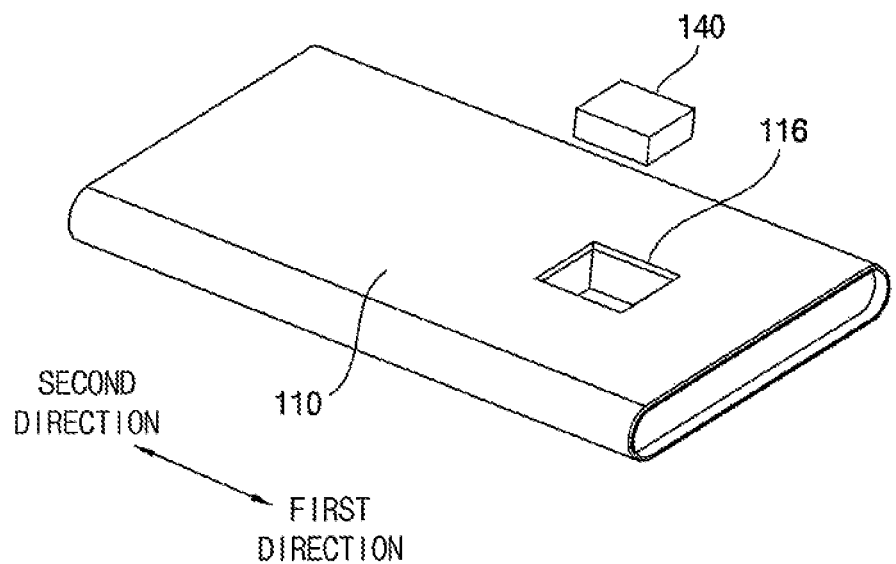

Referring to FIG. 25, the fingerprint sensor 140 may be inserted into the case 110 through the window 116.

Figure 26:
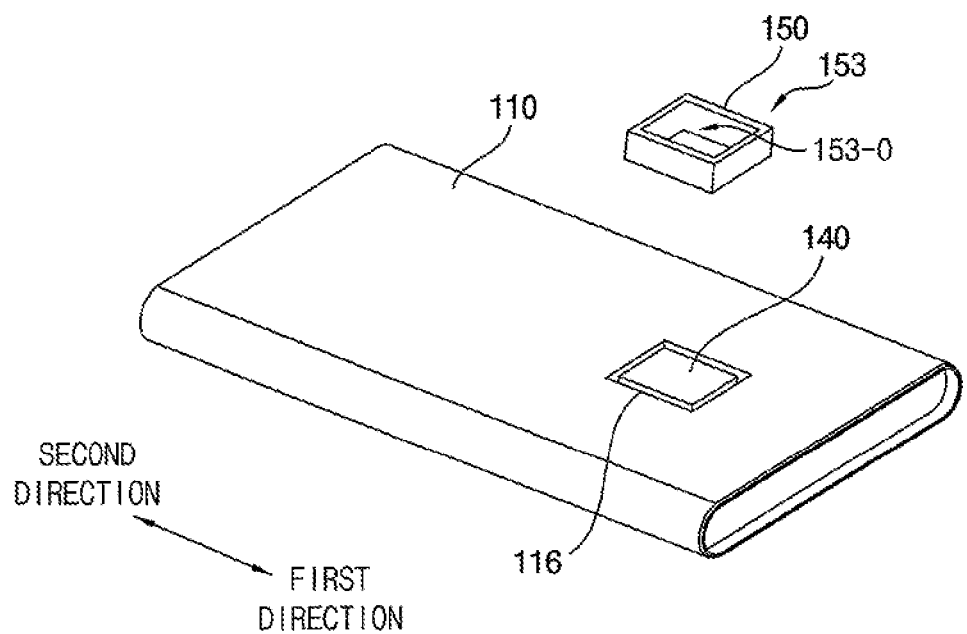

Referring to FIG. 26, the indicator 153 of the LED module 150 may be inserted into the case 110 through the window 116. The fingerprint sensor 140 may be positioned in the opening 153-0 of the indicator 153.

Figure 27:
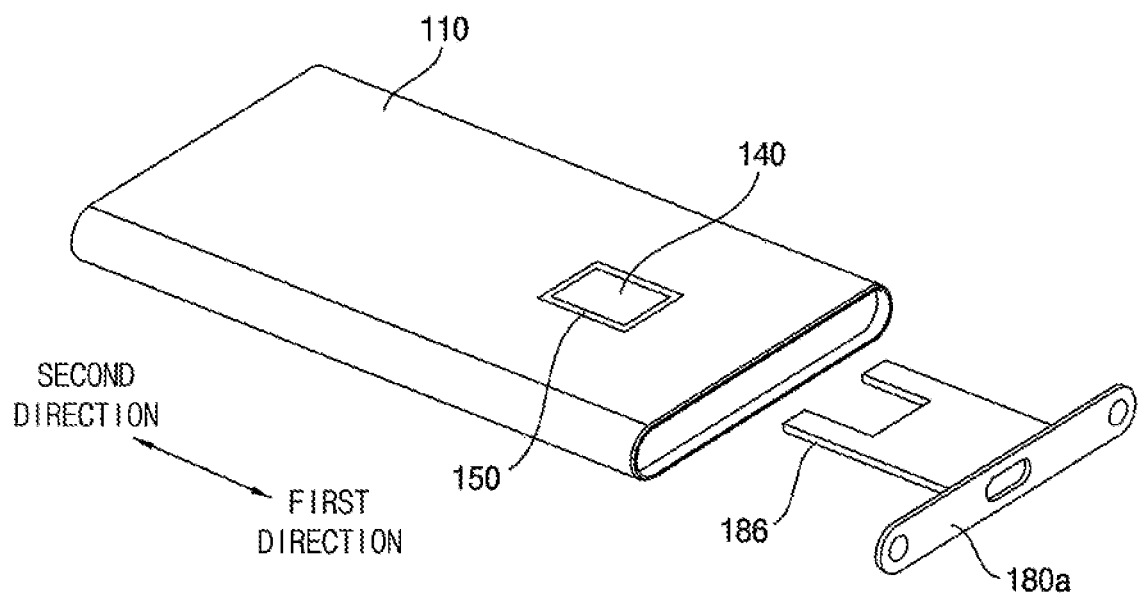

Referring to FIG. 27, the front bracket 180a may be inserted into the case 110 through the opened front surface 111 of the case 110 in the second direction. The supporting portions 186 of the front bracket 180a may be inserted into the supporting grooves 151 of the indicator 153.

Figure 28:
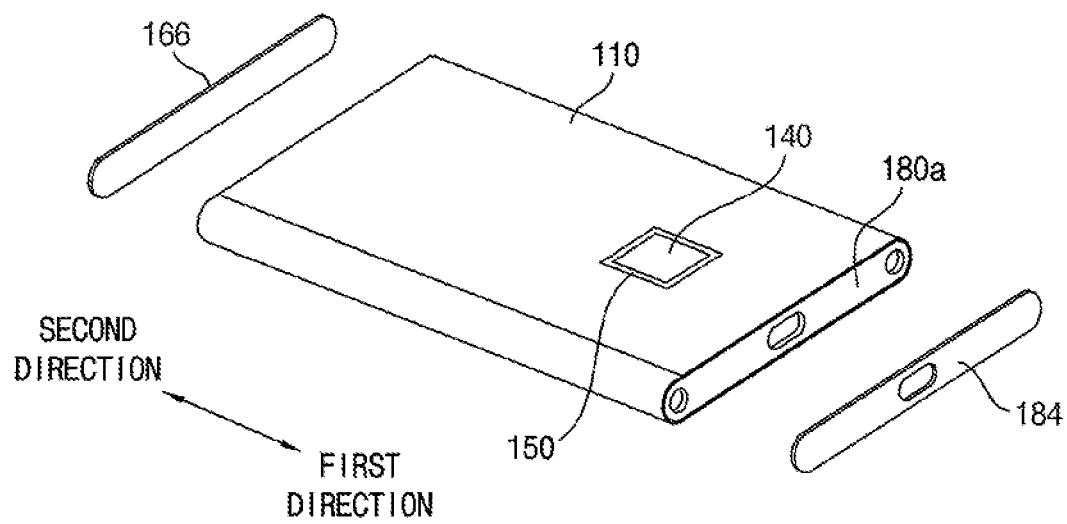

Referring to FIG. 28, the sheets 166 and 168 may be attached to the rear surface of the main bracket 160a and the front surface of the front bracket 180a to complete the portable SSD module 100a in FIG. 21.

Figure 29:
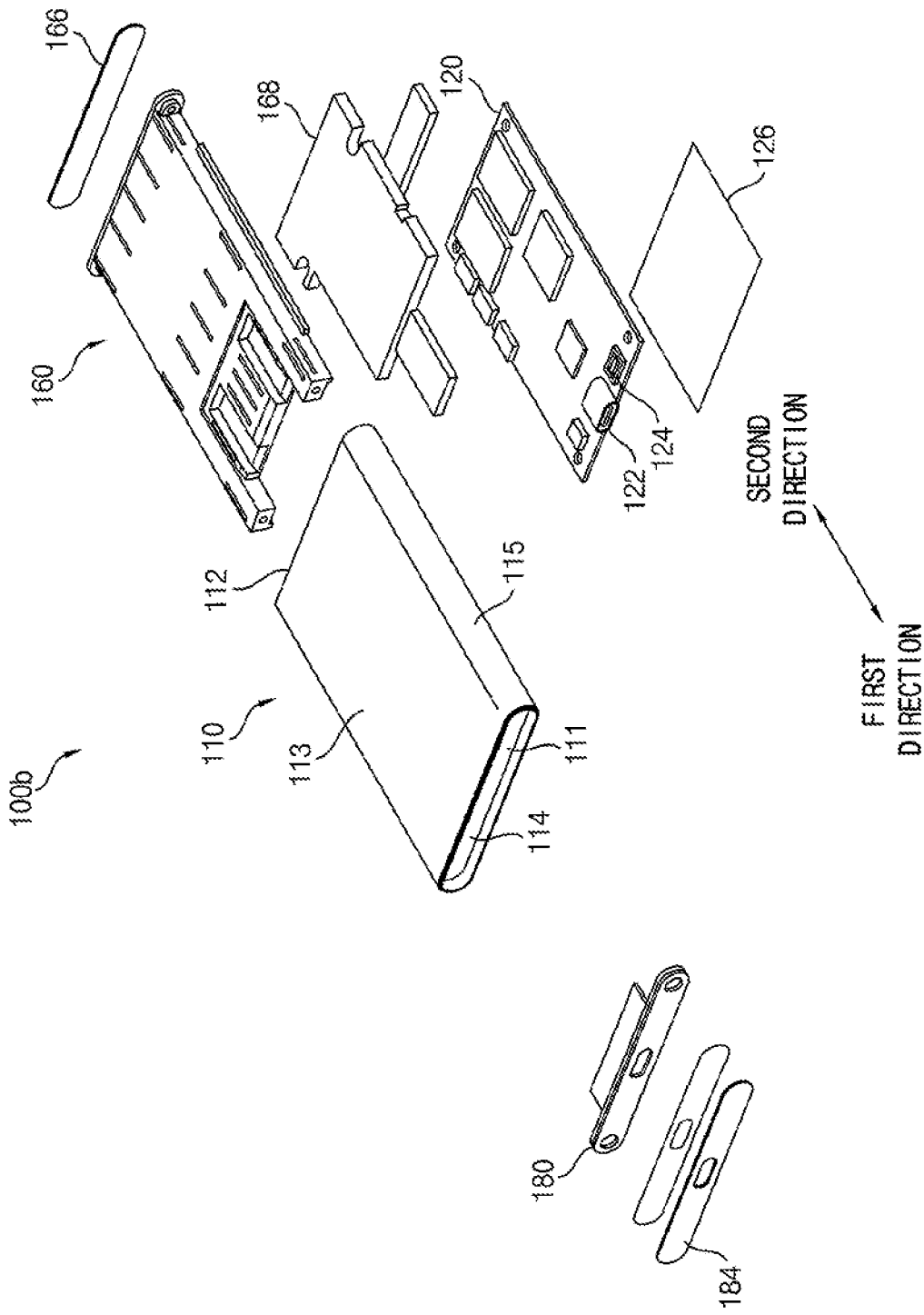

FIG. 29 is an exploded perspective view illustrating a portable SSD module in accordance with some example embodiments.

Referring to FIG. 29, a portable SSD module 100b of some example embodiments may include a case 110, an SSD 120, a main bracket 160 and a front bracket 180. That is, the portable SSD module 100b of this example embodiment may not include the fingerprint sensor 140 and the LED module 150 in the portable SSD module 100 of FIG. 1. This, because it may not be required to expose the fingerprint sensor 140 and the LED module 150 through the window 116 in FIG. 1, the case 110 may not have the window 116 in FIG. 1.

The case 110, the SSD 120, the main bracket 160 and the front bracket 180 may have structures substantially the same as those in FIG. 1. Thus, any further illustrations with respect to the case 110, the SSD 120, the main bracket 160 and the front bracket 180 may be omitted herein for brevity.

The main bracket 160 may be arranged in the case 110 to support the SSD 120. Particularly, the rib 176 of the main bracket 160 may slidably make contact with the upper surface of the case 110. The front bracket 180 may be arranged in the case 110 to support the connectors 122 and 124 extended from the SSD1 120.

Figure 30:
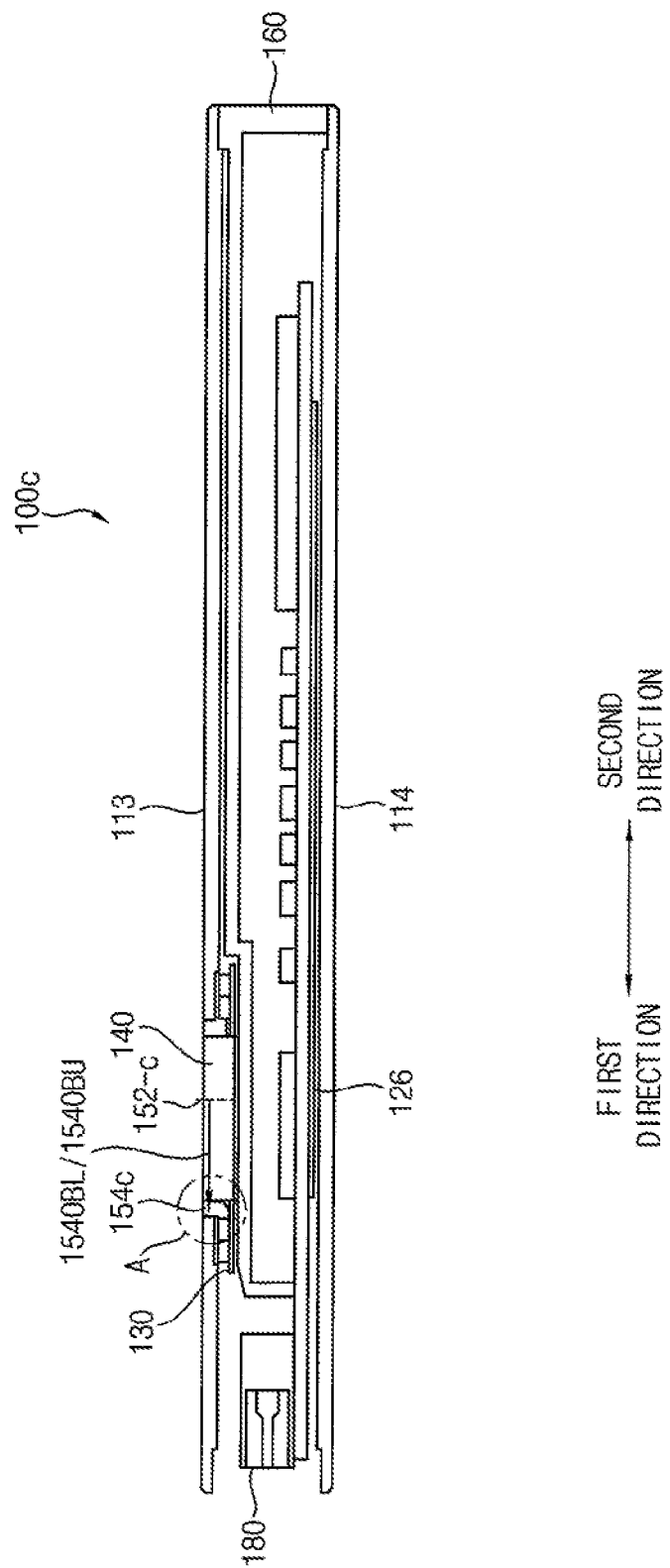
Figure 31:
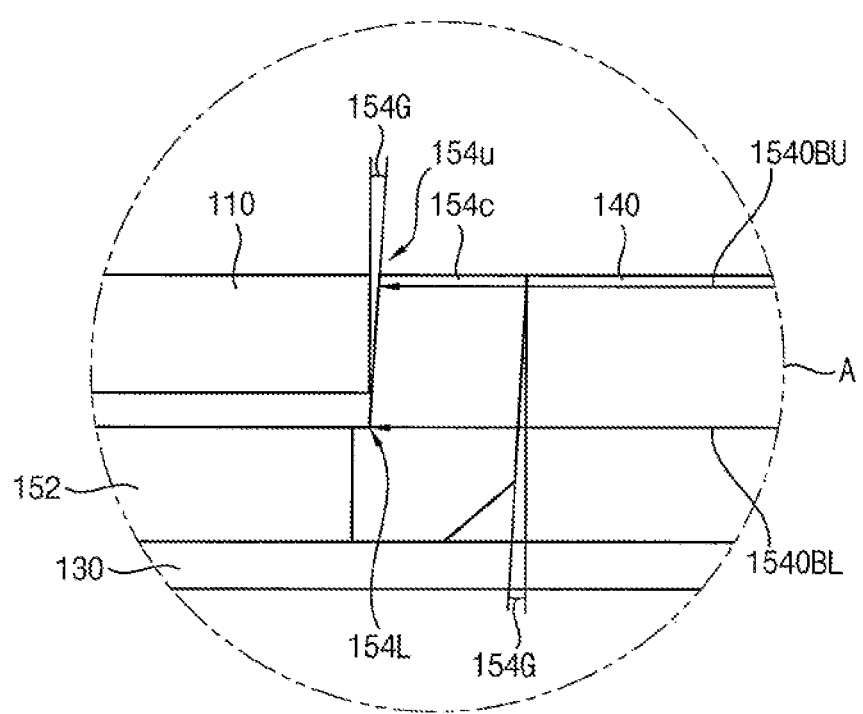

FIG. 30 is a cross-sectional view illustrating a portable SSD module in accordance with some example embodiments, and FIG. 31 is an enlarged cross-sectional view illustrating a portion "A" in FIG. 30.

A portable SSD module 100c of this example embodiment may include elements substantially the same as those of the portable SSD module 100 in FIG. 1 except for an indicator of an LED module. Thus, the same reference numerals may refer to the same elements and any further illustrations with respect to the same elements may be omitted herein for brevity.

Referring to FIGS. 30 and 31, an indicator 153 of this example embodiment may include an indicating plate 152 and an indicating channel 154c. The indicating plate 152 may have a structure substantially the same as that of the indicating plate 152 in FIG. 1. Thus, any further illustrations with respect to the indicating plate 152 may be omitted herein for brevity.

The indicating channel 154c may be configured to enter through the window 116 between the case 110 and the fingerprint sensor 140. In order to accurately align the indicator 153 and the fingerprint sensor 140 with a center of the window 116 when assembling the indicator 153 and the fingerprint sensor 140 with the window 116, the indicating channel 154c may have a gradient shape.

Particularly, as shown in FIGS. 30-31, the indicating channel 154c may have the gradient shape from a lower portion to an upper portion of the indicating channel 154c toward the center of the window 116, such that an outer boundary of the lower portion 154L of the indicating channel 154 may be distal (154OBL) from the central portion (e.g., center 152-C) of the indicating plate 152 in relation to the outer boundary of the upper portion 154U of the indicating channel 154 (154OBU). Similarly, as shown in FIG. 31, when the indicating channel 154c has a gradient shape. from a lower portion to an upper portion of the indicating channel 154c toward the center of the window 116, an inner boundary of the lower portion 154L of the indicating channel 154 may be distal from the central portion (e.g., center 152-C) of the indicating plate 152 in relation to the inner boundary of the upper portion 154U of the indicating channel 154. In some example embodiments, a gradient angle 154G of the indicating channel 154c that results in the indicating channel 154c having the gradient shape may be about 3° to about 3.5°. Thus, an upper portion of an inner surface of the indicating channel 154c having the gradient shape may be configured to make contact with an upper portion of an outer surface of the fingerprint sensor 140. Further, a lower portion of an outer surface of the indicating channel 154c may be configured to make contact with a lower portion of the upper surface 113 of the case 110. Because the fingerprint sensor 140 and the case may support the upper portion of the inner surface and the lower portion of the outer surface of the indicating channel 154c, the indicator 153 and the fingerprint sensor 140 may be accurately aligned with the center of the window 116.

In some example embodiments, the LED modules 150, 150a and 150b may be applied to the portable SSD modules having the above-mentioned structures. However, the LED modules 150, 150a and 150b may also be applied to the portable SSD modules having other structures. Further, the LED modules 150, 150a and 150b may be applied to other electronic devices requiring an emitting function in place of the portable SSD modules.

According to some example embodiments, the main bracket may be configured to support the LED module. Particularly, the slant rib of the main bracket inserted into the rear surface of the case may slidably make contact with the lower surface of the LED module. Thus, the LED module may be readily and firmly combined with the case.

Further, the indicator of the LED module may have the triangular diffusing groove so that the light from the LED may uniformly diffuse toward the whole indicator through the diffusing groove. Particularly, the light may diffuse toward a corner of the indicator. As a result, the indicator may have uniform brightness.

The foregoing is illustrative of some example embodiments and is not to be construed as limiting thereof. Although some example embodiments have been described, those skilled in the art will readily appreciate that many modifications are possible in the example embodiments without materially departing from the novel teachings and advantages of the present inventive concepts. Accordingly, all such modifications are intended to be included within the scope of the present inventive concepts as defined in the claims. In the claims, means-plus-function clauses are intended to cover the structures described herein as performing the recited function and not only structural equivalents but also equivalent structures. Therefore, it is to be understood that the foregoing is illustrative of various example embodiments and is not to be construed as limited to the specific example embodiments disclosed, and that modifications to the disclosed example embodiments, as well as other example embodiments, are intended to be included within the scope of the appended claims.

What is claimed is:

1. A portable solid-state drive (SSD) module comprising:
a case having a window;
an SSD arranged in the case;
a light-emitting device (LED) module arranged in the case to indicate an operation of the SSD through the window; and
a main bracket arranged in the case to support the LED module, wherein the main bracket is configured to upwardly support the LED module and wherein the main bracket comprises at least one rib formed on an upper surface of the main bracket, and wherein the at least one rib is downwardly inclined along a first direction corresponding to an entering direction of the main bracket into the case to slidably make contact with a lower surface of the LED module.

2. The SSD module of claim 1, wherein the case has an open front surface configured such that the main bracket may enter the case by traveling in a first direction, the case further comprising an open rear surface positioned opposite to the open front surface in the first direction.

3. The SSD module of claim 2, wherein the case further comprises:
an upper surface having the window;
a lower surface arranged under the upper surface; and
side surfaces connected between the upper surface and the lower surface.

4. The SSD module of claim 3, wherein the case has a structure where the upper surface and the lower surface are integrally formed with the side surfaces.

5. The SSD module of claim 3, wherein the upper surface and the lower surface each have a width longer than a height of the side surfaces.

6. A portable solid-state drive (SSD) module comprising:
a case having a window;
an SSD arranged in the case;
a light-emitting device (LED) module arranged in the case to indicate an operation of the SSD through the window; and
a main bracket arranged in the case to support the LED module, wherein the main bracket is configured to upwardly support the LED module, and wherein the main bracket comprises:
a body portion positioned between the case and the SSD;

- a pair of horizontal supporting portions horizontally extended from both portions of a front surface of the body portion to support both side surfaces of the LED module; and
- a vertical supporting portion arranged between the horizontal supporting portions to support a lower surface of the LED module.

7. The SSD module of claim 6, wherein the vertical supporting portion has a slanted upper surface along a first direction corresponding to an entering direction of the main bracket into the case, and the slanted upper surface is configured to slidably make contact with the lower surface of the LED module.

8. The SSD module of claim 6, wherein the vertical supporting portion has an upper surface lower than upper surfaces of the horizontal supporting portions to form a receiving groove for receiving the LED module between the vertical supporting portion and the horizontal supporting portions.

9. The SSD module of claim 6, wherein the vertical supporting portion comprises:
- a central supporting portion configured to support a central portion of the lower surface of the LED module; and
- a pair of edge supporting portions arranged at both sides of the central supporting portion to support edge portions of the lower surface of the LED module.

10. The SSD module of claim 9, wherein the central supporting portion and the edge supporting portions comprise a slanted upper surface along a first direction corresponding to an entering direction of the main bracket into the case, and wherein the slanted upper surface is configured to slidably make contact with the lower surface of the LED module.

11. The SSD module of claim 9, wherein the vertical supporting portion further comprises one or more ribs formed on upper surfaces of the central supporting portion and the edge supporting portions, and wherein the one or more ribs are downwardly inclined along a first direction corresponding to an entering direction of the main bracket into the case to slidably make contact with the lower surface of the LED module.

12. The SSD module of claim 9, wherein the central supporting portion has an opening configured to expose the SSD.

13. The SSD module of claim 12, wherein the opening has an open front surface.

14. The SSD module of claim 6, wherein the vertical supporting portion has a length shorter than that of the horizontal supporting portions.

15. A portable solid-state drive (SSD) module comprising:
- a case having a window;
- an SSD arranged in the case;
- a light-emitting device (LED) module arranged in the case to indicate an operation of the SSD through the window; and
- a main bracket arranged in the case to support the LED module,
- wherein the SSD module further comprises a front bracket arranged in the case to support connectors electrically connected between the SSD and the LED module, and
- wherein the LED module comprises at least one supporting groove and the front bracket comprises at least one supporting portion inserted into the supporting groove.

16. The SSD module of claim 15, further comprising a cushion interposed between the front bracket and the connectors.

17. The SSD module of claim 15, wherein the supporting groove is formed at both side surfaces of the LED module along a second direction corresponding to an entering direction of the front bracket into the case, and the at least one supporting portion is extended from both side portions of an inner surface of the front bracket in the second direction.

* * * * *